(12) United States Patent
Dai et al.

(10) Patent No.: US 12,203,783 B2
(45) Date of Patent: Jan. 21, 2025

(54) SENSOR, SENSING DEVICE, AND SENSING METHOD

(71) Applicant: TENCENT TECHNOLOGY (SHENZHEN) COMPANY LIMITED, Shenzhen (CN)

(72) Inventors: Yuan Dai, Shenzhen (CN); Zhengyou Zhang, Shenzhen (CN); Chuanfei Guo, Shenzhen (CN); Peng Lu, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 391 days.

(21) Appl. No.: 17/576,351

(22) Filed: Jan. 14, 2022

(65) Prior Publication Data

US 2022/0136870 A1  May 5, 2022

Related U.S. Application Data

(63) Continuation of application No. PCT/CN2020/124740, filed on Oct. 29, 2020.

(30) Foreign Application Priority Data

Jan. 17, 2020 (CN) .......................... 202010054425.6

(51) Int. Cl.
   *G01D 5/241* (2006.01)
(52) U.S. Cl.
   CPC .................................. *G01D 5/2417* (2013.01)

(58) Field of Classification Search
   CPC .... G01D 5/2417; G01R 31/382; G01R 33/02; G01N 27/9006; A61B 5/245; G01C 17/28; H04M 1/0277; H05K 1/181
   (Continued)

(56) References Cited

U.S. PATENT DOCUMENTS 11,592,946 B1 * 2/2023 Bechstein ............... G01L 1/142
11,860,667 B2 * 1/2024 Lee ........................ G06F 1/1671
(Continued)

FOREIGN PATENT DOCUMENTS

CN    102193675    9/2011
CN    108446042    8/2018
(Continued)

OTHER PUBLICATIONS

English translation of International Search Report issued Jan. 27, 2021 in International Application No. PCT/CN2020/124740.

*Primary Examiner* — Huy Q Phan
*Assistant Examiner* — Trung Q Nguyen
(74) *Attorney, Agent, or Firm* — Crowell & Moring LLP

(57) ABSTRACT

This disclosure relates to a sensor, a sensing device, and a sensing method. The sensor may include an upper electrode layer, a dielectric layer, and a lower electrode layer. A first dielectric layer surface of the dielectric layer may be attached to a first upper electrode surface of the upper electrode layer. A second dielectric layer surface of the dielectric layer may be attached to a first lower electrode surface of the lower electrode layer. The second dielectric layer surface may be opposite to the first dielectric layer surface. The upper electrode layer may include at least two sub-upper electrodes arranged in an array. An electrode gap may exist between the at least two sub-upper electrodes.

18 Claims, 13 Drawing Sheets

(58) Field of Classification Search
USPC .............. 324/430–435, 200, 207.14–207.18,
324/219–225, 239, 241, 637–639, 600,
324/500, 529, 530, 764.01, 134
See application file for complete search history.

(56) References Cited

U.S. PATENT DOCUMENTS

| | | | | |
|---|---|---|---|---|
| 12,105,919 | B2* | 10/2024 | Zha | ........................ G06F 3/0447 |
| 2017/0068383 | A1* | 3/2017 | Chern | ...................... G06F 3/044 |
| 2018/0224966 | A1* | 8/2018 | Church | ................. G06F 3/0446 |
| 2018/0321780 | A1* | 11/2018 | Park | ................... G06V 40/1306 |
| 2019/0003857 | A1 | 1/2019 | Hackl et al. | |
| 2022/0034728 | A1* | 2/2022 | Katsuhara | ............... G01L 5/165 |

FOREIGN PATENT DOCUMENTS

| | | |
|---|---|---|
| CN | 109163824 | 1/2019 |
| CN | 109708785 | 5/2019 |
| CN | 110132457 | 8/2019 |
| CN | 110243396 | 9/2019 |
| CN | 111238545 | 6/2020 |

* cited by examiner

SENSOR, SENSING DEVICE, AND SENSING METHOD

RELATED APPLICATION

This application is a continuation application of PCT Patent Application No. PCT/CN2020/124740, filed on Oct. 29, 2020, which claims priority to Chinese Patent Application No. 2020100544256, entitled "SENSOR, INTELLIGENT DEVICE, SENSING METHOD AND STORAGE MEDIUM" filed on Jan. 17, 2020, wherein the content of each of the above-referenced applications is incorporated herein by reference in its entirety.

FIELD OF THE TECHNOLOGY

This application relates to the field of automation of sensing technologies, and in particular, to a sensor, a device, and a sensing method.

BACKGROUND OF THE DISCLOSURE

With the rapid application of artificial intelligence in various industries, a sensor is widely used in an intelligent device. However, with the continuous widening and deepening of the intelligent devices, some application problems have also arisen, especially the most important safety problem of the intelligent device, for example, a collision problem between a robot and a target object during movement of the robot, and a problem that the target object or the robot is damaged due to excessively large applied pressure of the robot under load.

Generally, for the safety problem of the intelligent device, a proximity sensor is usually disposed at a specific position of the intelligent device to sense a distance between the target object and the intelligent device; or a tactile sensor is disposed at a specific position of the intelligent device, to sense a pressure applied between the target object and the intelligent device. That is, the sensor disposed on the intelligent device can sense only the distance from the target object or the force applied to the target object. Therefore, the sensing function of the sensor is single.

SUMMARY

Embodiments of this disclosure provide a sensor, a sensing device, and a sensing method.

The technical solutions in the embodiments of this disclosure are implemented as follows.

An embodiment of this disclosure provides a sensor. The sensor may include an upper electrode layer, a dielectric layer, and a lower electrode layer. A first dielectric layer surface of the dielectric layer may be attached to a first upper electrode surface of the upper electrode layer. A second dielectric layer surface of the dielectric layer may be attached to a first lower electrode surface of the lower electrode layer. The second dielectric layer surface may be opposite to the first dielectric layer surface. The upper electrode layer may include at least two sub-upper electrodes arranged in an array. An electrode gap may exist between the at least two sub-upper electrodes. The sensor may be configured to determine distance information from an approaching object according to first capacitance information at the electrode gap. The sensor may be further configured to determine an acting force acting on a contact object according to second capacitance information between the upper electrode layer and the lower electrode layer under action of the dielectric layer.

An embodiment of this disclosure provides a device. The device may include a controller and a sensor array connected to the controller. Each sensor in the sensor array may include an upper electrode layer, a dielectric layer, and a lower electrode layer. A first dielectric layer surface of the dielectric layer may be attached to a first upper electrode surface of the upper electrode layer. A second dielectric layer surface of the dielectric layer may be attached to a first lower electrode surface of the lower electrode layer. The second dielectric layer surface may be opposite to the first dielectric layer surface. The upper electrode layer may include at least two sub-upper electrodes arranged in an array. An electrode gap may exist between the at least two sub-upper electrodes. Distance information from an approaching object may be determined according to first capacitance information at the electrode gap. An acting force acting on a contact object may be determined according to second capacitance information between the upper electrode layer and the lower electrode layer under action of the dielectric layer.

An embodiment of this disclosure provides a sensing method, performed by the device described above. The method may include, in response to an approaching object approaching the device, obtaining a first capacitance information set by acquiring, with a controller of the device, first capacitance information at an electrode gap of each sensor in a sensor array of the device. The method may further include obtaining a distance information set by determining distance information from the approaching object according to the first capacitance information set. The method may further include, in response to the device acting on a contact object, obtaining a second capacitance information set by acquiring, with the controller of the device, second capacitance information between an upper electrode layer and a lower electrode layer under the action of a dielectric layer of each sensor. The method may further include determining, according to the second capacitance information set, an acting force acting on the contact object, to obtain an acting force set. The method may further include completing dual-modal sensing on a target object according to the distance information set and the acting force set. The target object may include the approaching object and the contact object.

An embodiment of this disclosure provides a computer-readable storage medium, storing executable instructions, the executable instructions, when executed by a controller, implementing the sensing method according to the embodiments of this disclosure.

The embodiments of this disclosure have the following beneficial effects: because a sensor includes a three-layer sensing structure formed by an upper electrode layer, a dielectric layer, and a lower electrode layer, the sensor can sense, according to capacitance information of the three-layer sensing structure, an acting force acting on a contact object. Moreover, because the upper electrode layer is formed by at least two sub-upper electrodes, distance information from an approaching object can be sensed according to capacitance information at an electrode gap between the at least two sub-upper electrodes Therefore, two manners of proximity sensing and contact sensing on a target object can be achieved, thereby improving a sensing level and improving the diversity of a sensing function of the sensor.

DESCRIPTION OF EMBODIMENTS

Figure 1:
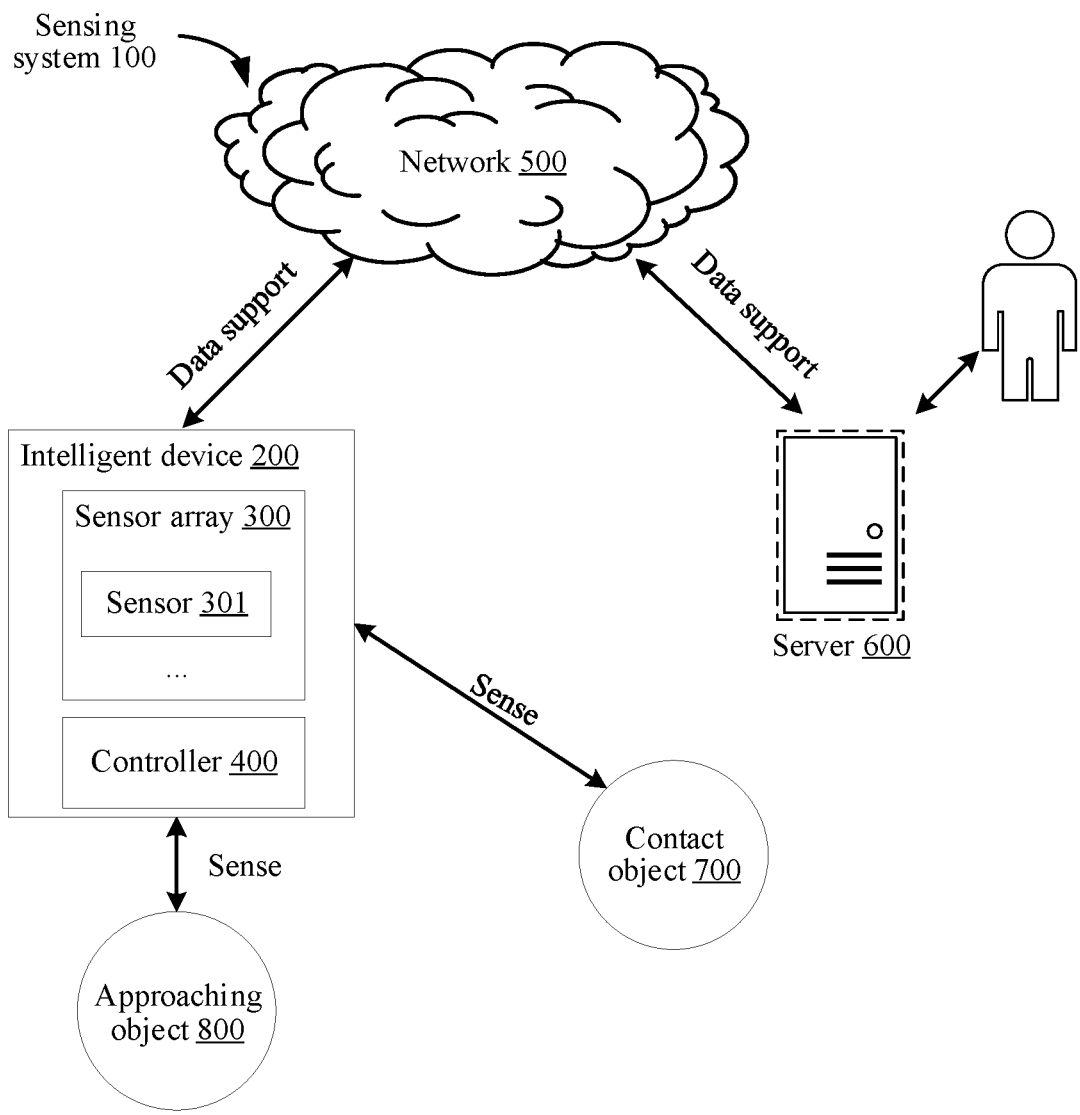
FIG. 1 is an exemplary schematic architectural diagram illustrating a sensing system according to an embodiment of this disclosure.

To make the objectives, technical solutions, and advantages of this disclosure clearer, the following describes this disclosure in further detail with reference to the accompanying drawings. The described embodiments are not to be considered as a limitation to this disclosure. All other embodiments obtained by a person of ordinary skill in the art without creative efforts shall fall within the protection scope of this disclosure.

In the following description, the term "some embodiments" describes subsets of all possible embodiments, but it may be understood that "some embodiments" may be the same subset or different subsets of all the possible embodiments, and can be combined with each other without conflict.

In the following descriptions, the included term "first/second" is merely intended to distinguish similar objects but does not necessarily indicate a specific order of an object. It may be understood that "first/second" is interchangeable in terms of a specific order or sequence if permitted, so that the embodiments of this disclosure described herein can be implemented in a sequence in addition to the sequence shown or described herein.

Unless otherwise defined, meanings of all technical and scientific terms used in the embodiments of this disclosure are the same as those usually understood by a person skilled in the art to which this disclosure belongs. Terms used in the embodiments of this disclosure are merely intended to describe objectives of the embodiments of this disclosure, but are not intended to limit this disclosure.

Before the embodiments of this disclosure are further described in detail, a description is made on nouns and terms in the embodiments of this disclosure, and the nouns and terms in the embodiments of this disclosure are applicable to the following explanations.

(1) Proximity sensor is a device having a capability of sensing proximity of an object. Proximity of an object is recognized by using a sensitive characteristic of a sensor to an approaching object, and a corresponding electric signal is outputted.

(2) Contact sensor, that is, a tactile sensor, generally refers to a sensor imitate a tactile function in a robot.

(3) Sensor array is an array formed by arranging a group of sensors at different spatial positions in a specific manner.

(4) Electrode is a component in an electronic device or an appliance and is used as two ends for inputting or leading out a current in a conductive medium (for example, solid, gas, vacuum, or electrolyte solution). One electrode for inputting the current is referred to as an anode or a positive electrode, and one electrode for leading out the current is referred to as a cathode or a negative electrode. In the embodiments of this disclosure, the electrode includes an upper electrode layer and a lower electrode layer.

(5) Interdigital electrode is an electrode having a periodic pattern such as a finger shape or a comb shape in a surface and is configured to generate a capacitance related to an electric field of a penetrable material or a sensitive coating.

In recent years, large-scale mechanical and automatic intelligent processing robots have gradually entered industrial production, and born more and more production work in industrial production. The robots can not only replace labor to reduce labor costs, but also provide more efficient and stable labor, so that smaller and more flexible robots are used. Some practical problems have arisen while the application of the robot is continuously widened and deepened, especially, the most important safety problem of the robot. The robot cannot sense an ambient environment due to a stylized movement manner and easily collides with a target object during movement. Under a load, the robot or a loaded object is prone to damage due to excessive pressure, or the robot cannot achieve a load function due to excessively small pressure and cannot adjust an applied pressure in real time by sensing magnitude of the pressure and cannot perform a flexible and intelligent operation, and the like. That is, the development of the application of the robot faces the safety problem in terms of proximity and contact.

Generally, in terms of proximity, the robot usually senses a position of a target object based on a vision, a wave, and an electromagnetic field. When distance measurement is performed based on the vision, the target object is generally recognized by loading a camera device on the robot, to obtain a real-scene size of the target object, and then a distance between the target object and the robot loaded with the camera device by using a result of comparison between the real-scene size of the target object and an actual size of the target object, so that the distance from the target object is measured and the target object is also recognized. However, the target object can be recognized based on the vision and the distance between the target object and the robot can be calculated, but during implementation, the camera device is required, and an opening needs to be separately designed on a surface of the robot, resulting in high costs and great difficulty. In addition, the camera device is made of a hard material and has poor conformal adhesion to an exoskeleton of the robot. As a result, the camera device cannot be formed on an electronic skin of the surface of the robot. In conclusion, a large quantity of camera devices cannot be arranged on the surface of the robot, and consequently omnidirectional sensing on the target object cannot be implemented. Consequently, the robot has a relatively small applicable range due to a relatively low sensing sensitivity of the robot loaded with the camera device.

When distance measurement is performed based on the wave, detection is usually performed by using an optical component or an acoustic component. A distance from an object is obtained through calculation by acquiring a reflection time or a phase difference of a light wave or a sound wave, and tens of meters can be measured and the millimeter-level accuracy can be achieved. However, a complex light wave or sound wave transmitting and receiving system is required during distance measurement based on the light wave and the sound wave, and a large quantity of transmitting and receiving systems cannot be arranged on the surface of the robot due to a large volume. As a result, omnidirectional sensing on the target object cannot be implemented. Consequently, the robot based on the transmitting and receiving system has a relatively small implementation, a relatively low sensing sensitivity, and a relatively small application range.

When distance measurement is performed based on the electromagnetic field, the impact of the target object on an electromagnetic field excited by the sensor is usually obtained by using an inductive sensor or a capacitive sensor, to sense a distance. However, only distance sensing can be implemented, and the sensor has a single sensing function.

In addition, in terms of contact, pressure sensing is generally implemented by using a tactile sensor. For example, a single thin film capacitance pressure plate or strain gauge is used as the tactile sensor of the robot. However, only contact sensing can be implemented, and only a single tactile sensor can be placed at a specific position of the robot to perform sensing. As a result, omnidirectional sensing cannot be implemented. In addition, the tactile sensor is made of a hard material and has poor conformal adhesion to the exoskeleton of the robot. As a result, the tactile sensor cannot be formed on the electronic skin of the surface of the robot. The sensor obtained through the capacitance pressure plate has a relatively low sensitivity to pressure sensing and relatively poor distinguishability to the pressure. Consequently, the sensor has relatively poor sensing performance.

Based on the foregoing, the sensor has the following problems that: a sensing sensitivity is low, and omnidirectional sensing cannot be implemented; the function is single, and either only proximity sensing or contact sensing can be implemented; and an applicable range is small, and the sensor can be disposed on only a specific part of the robot.

In addition, for the problem of the single sensing function, there is another sensing manner. For example, a conformal U-shaped plate electrode is designed at an end portion of a machine hand, and contact sensing of the target object is implemented by using an electric field of the plate electrode. A thin film pressing switch is arranged below an edge portion and a middle portion of the plate electrode, so that a specific pressure sensing capability is achieved. In this way, although two functions of proximity sensing and contact sensing are achieved, the proximity sensing and the contact sensing can be implemented on only a conducted target object, resulting in relatively poor universality.

Based on this, the embodiments of this disclosure provide a sensor, a device, a sensing method and apparatus, and a computer-readable storage medium, a sensitivity and a sensing level of the sensor can be improved, the sensing function is diversified, the applicable range is expanded, and the universality is achieved. An exemplary application of an intelligent device provided by the embodiments of this disclosure is described below.

FIG. 1 is an exemplary schematic architectural diagram illustrating a sensing system 100 according to an embodiment of this disclosure. To implement application of sensing, in the sensing system 100, an intelligent device 200 includes a sensor array 300 and a controller 400, the sensor array 300 being formed by at least one sensor 301. The intelligent device 200 is connected to a server 600 through a network 500. The network 500 may be a wide area network, a local area network, or a combination of thereof. In addition, the sensing system 100 further includes a contact object 700 and an approaching object 800.

The intelligent device 200 is configured to perform contact sensing on the contact object 700 and perform proximity sensing on the approaching object 800 by using the sensor array 300 and the controller 400.

The server 600 is configured to provide data support for implementing a function service to the intelligent device 200 by using the network 500.

Figure 2:
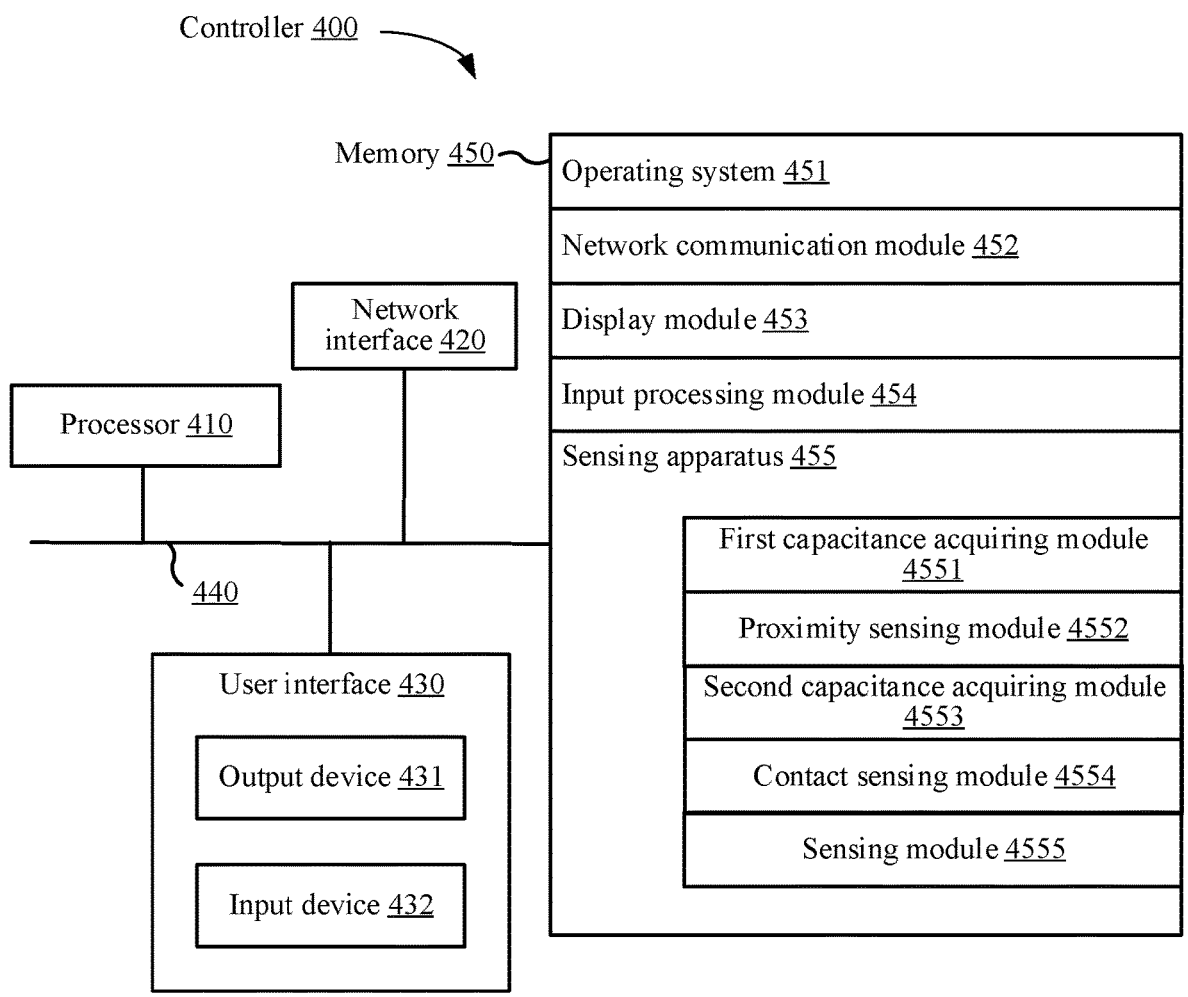
FIG. 2 is an exemplary schematic structural diagram illustrating a controller in FIG. 1 according to an embodiment of this disclosure.

FIG. 2 is a schematic structural diagram illustrating a controller 400 in FIG. 1 according to an embodiment of this disclosure. The controller 400 shown in FIG. 2 includes: at least one processor 410, a memory 450, at least one network interface 420, and a user interface 430. Components in the controller 400 are coupled together by using a bus system 440. It may be understood that the bus system 440 is configured to implement connection and communication between the components. In addition to a data bus, the bus system 440 further includes a power bus, a control bus, and a status signal bus. However, for ease of clear description, all types of buses are marked as the bus system 440 in FIG. 2.

The processor 410 may be an integrated circuit chip having a signal processing capability, for example, a general-purpose processor, a digital signal processor (DSP), or another programmable logic device (PLD), discrete gate, transistor logical device, or discrete hardware component. The general-purpose processor may be a microprocessor, any other conventional processor, or the like.

The user interface 430 includes one or more output apparatuses 431 that enable presentation of media content, including one or more speakers and/or one or more visual display screens. The user interface 430 further includes one or more input apparatuses 432, including user interface components that facilitate inputting of a user, such as a keyboard, a mouse, a microphone, a touch display screen, a camera, and other input buttons and controls.

The memory 450 includes a volatile memory or a non-volatile memory, or may include a volatile memory and a non-volatile memory. The non-volatile memory may be a read-only memory (ROM), and the volatile memory may be a random access memory (RAM). The memory 450 described in this embodiment of this disclosure is to include any other suitable type of memories. The memory 450 may include one or more storage devices that are physically away from the processor 410.

In some embodiments, the memory 450 can store data to support various operations. Examples of the data include programs, modules, and data structures, or a subset or a superset thereof, which are illustrated below.

The term module (and other similar terms such as unit, submodule, etc.) may refer to a software module, a hardware module, or a combination thereof. A software module (e.g., computer program) may be developed using a computer programming language. A hardware module may be implemented using processing circuitry and/or memory. Each module can be implemented using one or more processors (or processors and memory). Likewise, a processor (or processors and memory) can be used to implement one or more modules. Moreover, each module can be part of an overall module that includes the functionalities of the module. A module is configured to perform functions and achieve goals such as those described in this disclosure, and may work together with other related modules, programs, and components to achieve those functions and goals.

An operating system 451 includes a system program configured to process various basic system services and perform a hardware-related task, for example, a framework layer, a core library layer, and a driver layer, and is configured to implement various basic services and process a hardware-related task.

A network communication module 452 is configured to reach another computing device through one or more (wired or wireless) network interfaces 420. Exemplary network interfaces 420 include: Bluetooth, wireless compatible authentication (Wi-Fi), a universal serial bus (USB), and the like.

A display module 453 is configured to display information by using an output apparatus 431 (for example, a display screen or a speaker) associated with one or more user interfaces 430 (for example, a user interface configured to operate a peripheral device and display content and information).

An input processing module 454 is configured to detect one or more user inputs or interactions from one of the one or more input apparatuses 432 and translate the detected input or interaction.

In some embodiments, the sensing apparatus provided in this embodiment of this disclosure may be implemented by using software. FIG. 2 shows a sensing apparatus 455 stored in the memory 450. The sensing apparatus may be software in a form such as a program and a plug-in, and includes the following software modules: a first capacitance acquiring module 4551, a proximity sensing module 4552, a second capacitance acquiring module 4553, a contact sensing module 4554, and a sensing module 4555. The following describes a function of each module.

In some other embodiments, the sensing apparatus provided in this embodiment of this disclosure may be implemented by using hardware. For example, the sensing apparatus provided in this embodiment of the disclosure may be a processor in a form of a hardware decoding processor, programmed to perform the sensing method provided in the embodiments of the disclosure. For example, the processor in the form of a hardware decoding processor may use one or more application-specific integrated circuits (ASIC), a DSP, a programmable logic device (PLD), a complex programmable logic device (CPLD), a field-programmable gate array (FPGA), or other electronic components.

Figure 3:
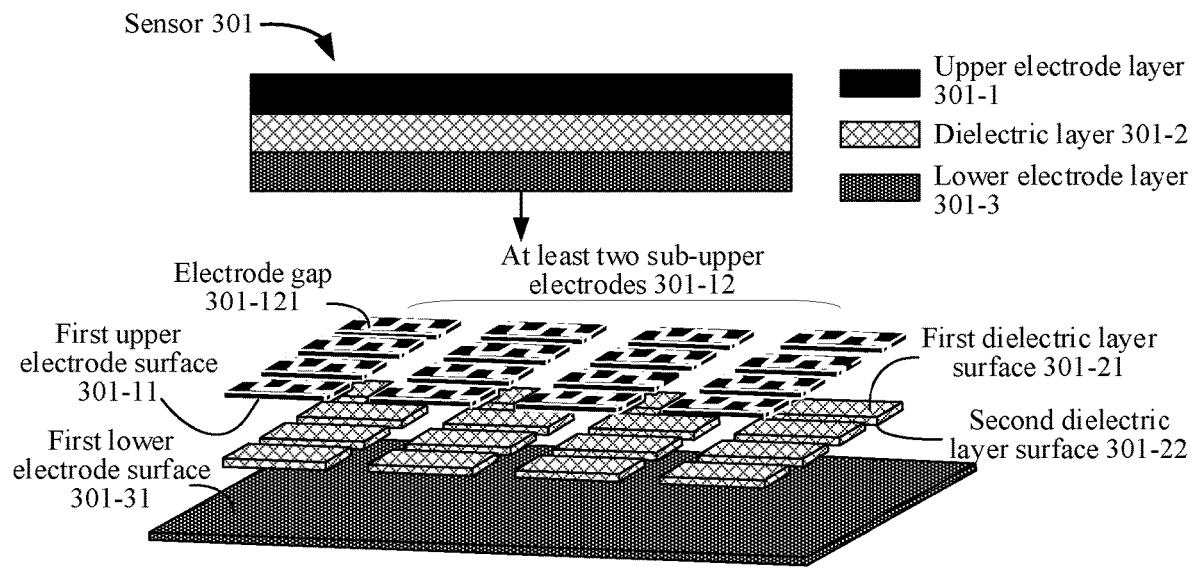
FIG. 3 is an exemplary schematic structural diagram illustrating a sensor according to an embodiment of this disclosure.

A structure of the sensor 301 provided in this embodiment of this disclosure is described below. FIG. 3 is an exemplary schematic structural diagram illustrating a sensor according to an embodiment of this disclosure. A structure shown in FIG. 3 is described based on FIG. 1.

In this embodiment of this disclosure, the sensor 301 includes: an upper electrode layer 301-1, a dielectric layer 301-2, and a lower electrode layer 301-3. A first dielectric layer surface 301-21 of the dielectric layer 301-2 is attached to a first upper electrode surface 301-11 of the upper electrode layer 301-1. A second dielectric layer surface 301-22 of the dielectric layer 301-2 is attached to a first lower electrode surface 301-31 of the lower electrode layer 301-3. The second dielectric layer surface 301-22 is opposite to the first dielectric layer surface 301-21. The upper electrode layer 301-1 includes at least two sub-upper electrodes 301-12 arranged in an array. An electrode gap 301-121 exists between the at least two sub-upper electrodes 301-12, and distance information from an approaching object 800 is determined according to first capacitance information at the electrode gap 301-121. An acting force acting on a contact object 700 is determined according to second capacitance information between the upper electrode layer 301-1 and the lower electrode layer 301-3 under the action of the dielectric layer 301-2.

The sensor 301 corresponds to a three-layer sensing structure. The dielectric layer 301-2 is an intermediate layer between the upper electrode layer 301-1 and the lower electrode layer 301-3. Therefore, one surface, that is, the first dielectric layer surface 301-21, of two opposite surfaces of the dielectric layer 301-2 is attached to one surface, that is, the first upper electrode surface 301-11 of the upper electrode layer 301-1, and the other surface, that is, the second dielectric layer surface 301-22, of the two opposite surfaces of the dielectric layer is attached to one surface, that is, the first lower electrode surface 301-31, of the lower electrode layer. Therefore, in an aspect, the three-layer sensing structure formed by the upper electrode layer 301-1, the dielectric layer 301-2, and the lower electrode layer 301-3 of the sensor 301 is a three-layer sensing structure of a contact sensor. Moreover, because when the sensor 301 is in contact with the contact object 700, the sensor 301 can sense, according to a relationship between a counter-acting force and an acting force, an acting force caused by contact between the sensor and the contact object 700. A magnitude of the acting force between the sensor 301 and the contact object 700 is related to the second capacitance information between the upper electrode layer 301-1 and the lower electrode layer 301-3, and a change of the second capacitance information between the upper electrode layer 301-1 and the lower electrode layer 301-3 is caused by a change of the dielectric layer 301-2. Therefore, based on the foregoing, the sensor 301 can determine the acting force acting on the contact object 700 according to the second capacitance information between the upper electrode layer 301-1 and the lower electrode layer 301-3 under the action of the dielectric layer 301-2.

In another aspect, there is a gap between sub-upper electrodes in the at least two sub-upper electrodes 301-12 arranged in the array and included in the upper electrode layer 301-1, which is referred to as the electrode gap 301-121 in this embodiment of this disclosure. In addition, an out-of-plane closed electric field can be formed at the electrode gap 301-121. When a distance between the approaching object 800 and the sensor 301 is changed, closing of a loop of the electric field and distribution of the electric field are affected, and a capacitance in the electric field is also changed. Therefore, the sensor 301 can determine distance information between the sensor and the approaching object 800 according to first capacitance information at the electrode gap.

A sequence between the upper electrode layer 301-1 and the lower electrode layer 301-3 in level is not specifically limited in this embodiment of this disclosure. In addition, the lower electrode layer 301-3 is further configured to shield proximity sensing on the at least two sub-upper electrodes 301-12, to shield electric field interference inside the intelligent device applied thereto.

Figure 4:
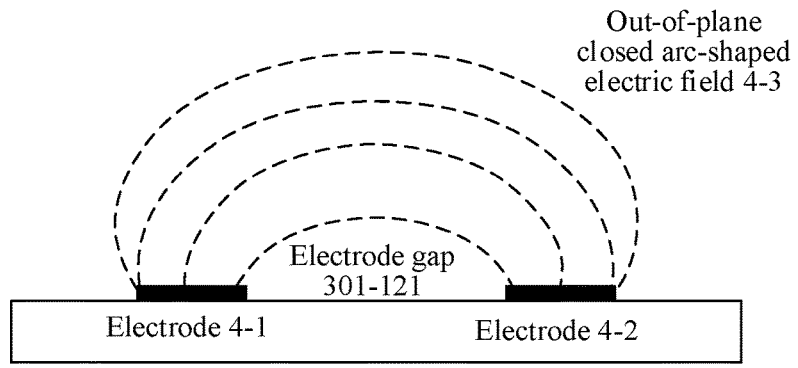
FIG. 4 is an exemplary schematic diagram illustrating an electric field at an electrode gap according to an embodiment of this disclosure.

For example, FIG. 4 is an exemplary schematic diagram illustrating an electric field at an electrode gap according to an embodiment of this disclosure. As shown in FIG. 4, the at least two sub-upper electrodes 301-12 include two sub-upper electrodes: an electrode 4-1 and an electrode 4-2. The electrode 4-1 and the electrode 4-2 form an out-of-plane closed arc-shaped electric field 4-3 (the out-of-plane closed electric field) at the electrode gap 301-121.

It may be understood that in this embodiment of this disclosure, a distance from an approaching object is sensed by using one electrode layer of a three-layer sensing structure of a contact sensor, and then dual-modal sensing of contact sensing and proximity sensing of the sensor is implemented, so that the proximity sensor and the contact sensor are combined, to improve a sensing level of the robot.

Figure 5:
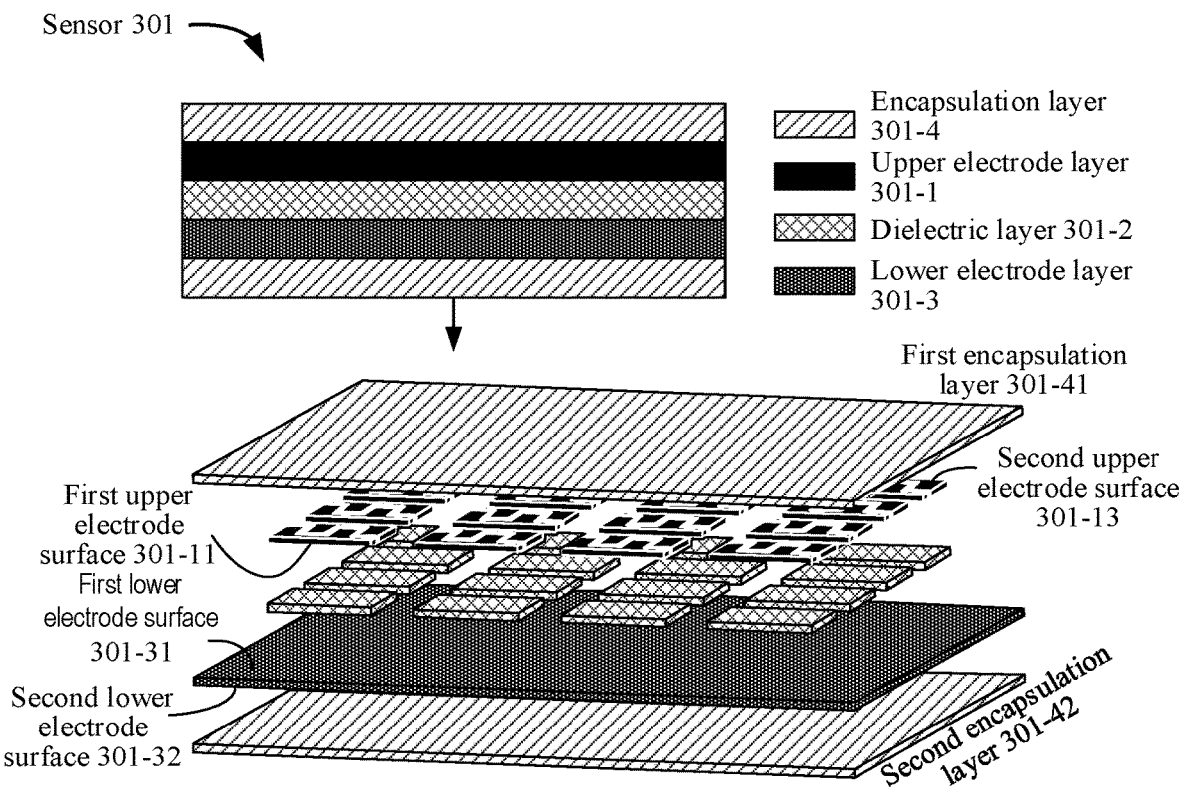
FIG. 5 is another exemplary schematic structural diagram illustrating a sensor according to an embodiment of this disclosure.

FIG. 5 is another exemplary schematic structural diagram illustrating a sensor according to an embodiment of this disclosure. As shown in FIG. 5, the sensor 301 in this embodiment of this disclosure further includes an encapsulation layer 301-4, the encapsulation layer 301-4 being configured to encapsulate the three-layer sensing structure formed by the upper electrode layer 301-1, the dielectric layer 301-2, and the lower electrode layer 301-3 in the sensor 301.

The encapsulation layer 301-4 may encapsulate the sensing structure of the sensor 301 by wrapping or partially attaching. This is not specifically limited in this embodiment of this disclosure. Herein, the encapsulation layer 301-4 is a substrate of the electrode.

Still referring to FIG. 5, the encapsulation layer 301-4 includes a first encapsulation layer 301-41 and a second encapsulation layer 301-42. The first encapsulation layer 301-41 is configured to be encapsulated on a second upper electrode surface 301-13 of the upper electrode layer 301-1.

The second upper electrode surface 301-13 is opposite to the first upper electrode surface 301-11. The second encapsulation layer 301-42 is configured to be encapsulated on a second lower electrode surface 301-32 of the lower electrode layer 301-3. The second lower electrode surface 301-32 is opposite to the first lower electrode surface 301-31.

The first encapsulation layer 301-41 is configured to encapsulate the upper electrode layer 301-1 of the sensor 301 by attaching the first encapsulation layer to the second upper electrode surface 301-13 of the upper electrode layer 301-1. The second encapsulation layer 301-42 is configured to encapsulate the lower electrode layer 301-3 of the sensor 301 by attaching the second encapsulation layer to another surface of the second lower electrode surface 301-32 of the lower electrode layer 301-3. In this way, a five-layer sensing structure in this embodiment of this disclosure is formed.

In this embodiment of this disclosure, the first encapsulation layer 301-41 is used as an electrode substrate of the upper electrode layer 301-1, and the second encapsulation layer 301-42 is used as an electrode substrate of the lower electrode layer 301-3.

In this embodiment of this disclosure, the encapsulation layer 301-4 of the sensor 301 is a flexible material thin film encapsulation layer.

The flexible material thin film encapsulation layer is an encapsulation layer made of a flexible material thin film, that is, a material used by the encapsulation layer 301-4 is the flexible material thin film, for example, a polymer film. Therefore, the sensor 301 has flexibility. In addition, the encapsulation layer 301-4 may be further configured to encapsulate all the periphery of the sensor 301.

In this embodiment of this disclosure, each sub-upper electrode 301-122 of the at least two sub-upper electrodes 301-12 of the sensor 301 is an interdigital electrode or a circular electrode.

In this embodiment of this disclosure, a type of each sub-upper electrode 301-122 may be an interdigital-type (in this case, each sub-upper electrode 301-122 is an interdigital electrode), or may be a circular-type (in this case, each sub-upper electrode 301-122 is a circular electrode), or may be a U-shaped type, or may be another type. A specific type pf each sub-upper electrode 301-122 is not limited in this embodiment of this disclosure.

Herein, different types of electrodes may be further used for each sub-upper electrode 301-122 of the at least two sub-upper electrodes 301-12. For example, when the at least two sub-upper electrodes 301-12 include two sub-upper electrodes, one of the two sub-upper electrodes may be the interdigital electrode, and the other may be the circular electrode.

In this embodiment of this disclosure, each sub-upper electrode 301-122 of the at least two sub-upper electrodes 301-12 of the sensor 301 is at least one of a conductive carbon cloth electrode, an evaporation metal electrode, a printed electrode, or a spraying metal mesh electrode.

The conductive carbon cloth electrode is an electrode made of a conductive carbon cloth. During manufacturing, for example, the conductive carbon cloth may be cut into a size of an electrode by using a laser, to obtain the conductive carbon cloth electrode. The conductive carbon cloth electrode has bending performance, so that the sensor 301 has the flexibility. The evaporation metal electrode is a metal electrode obtained by evaporating a conductive metal on a polymer (for example, polyethylene terephthalate (PET) or polyimide (PI)) thin film. Evaporation may be implemented according to a preset electrode array. Herein, the preset electrode array refers to a disposition position corresponding to each sub-upper electrode 301-122 of the at least two sub-upper electrodes 301-12. The printed electrode is an electrode printed on a rubber (for example, thermoplastic polyurethanes (TPU) rubber) thin film. Printing may be implemented according to a mask of the preset electrode array. The spraying metal mesh electrode is a metal mesh electrode formed by spraying a silver nanowire on a polymer thin film. Spraying may be implemented according to the mask of the preset electrode array. In addition, the conductive carbon cloth electrode, the evaporation metal electrode, the printed electrode, and the spraying metal mesh electrode are all flexible electrodes. In this embodiment of this disclosure, each sub-upper electrode 301-122 may be further another electrode with flexibility in addition to being any one of the conductive carbon cloth electrode, the evaporation metal electrode, the printed electrode, or the spraying metal mesh electrode.

In this embodiment of this disclosure, when each sub-upper electrode 301-122 in the sensor 301 is the interdigital electrode, the at least two sub-upper electrodes 301-12 are coplanar and staggered.

The at least two sub-upper electrodes 301-12 are coplanar and the at least two sub-upper electrodes 301-12 are staggered, so that an out-of-plane closed electric field is formed.

Figure 6:
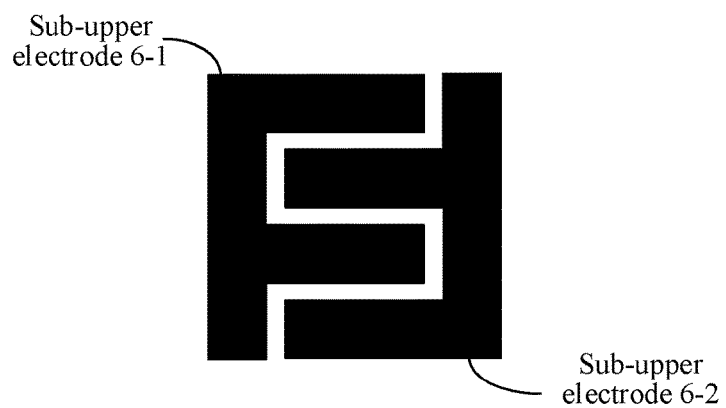
FIG. 6 is an exemplary schematic diagram illustrating disposition of two sub-upper electrodes according to an embodiment of this disclosure.

For example, FIG. 6 is an exemplary schematic diagram illustrating disposition of two sub-upper electrodes according to an embodiment of this disclosure. As shown in FIG. 6, two interdigital electrodes (the at least two sub-upper electrodes 301-12), that is, a sub-upper electrode 6-1 and a sub-upper electrode 6-2, are coplanar and staggered.

In addition, the at least two sub-upper electrodes 301-12 are related to proximity sensing performance of the sensor 301. Herein, a quantity of electrode fingers and a length-width ratio of an electrode finger of each sub-upper electrode 301-122 and an interdigital gap between the at least two sub-upper electrodes 301-12 are both related to the proximity sensing performance of the sensor 301. In an actual application, the quantity of electrode fingers and the length-width ratio of the electrode finger of each sub-upper electrode 301-122 and the interdigital gap between the at least two sub-upper electrodes 301-12 may be set according to actual requirements.

Figure 7:
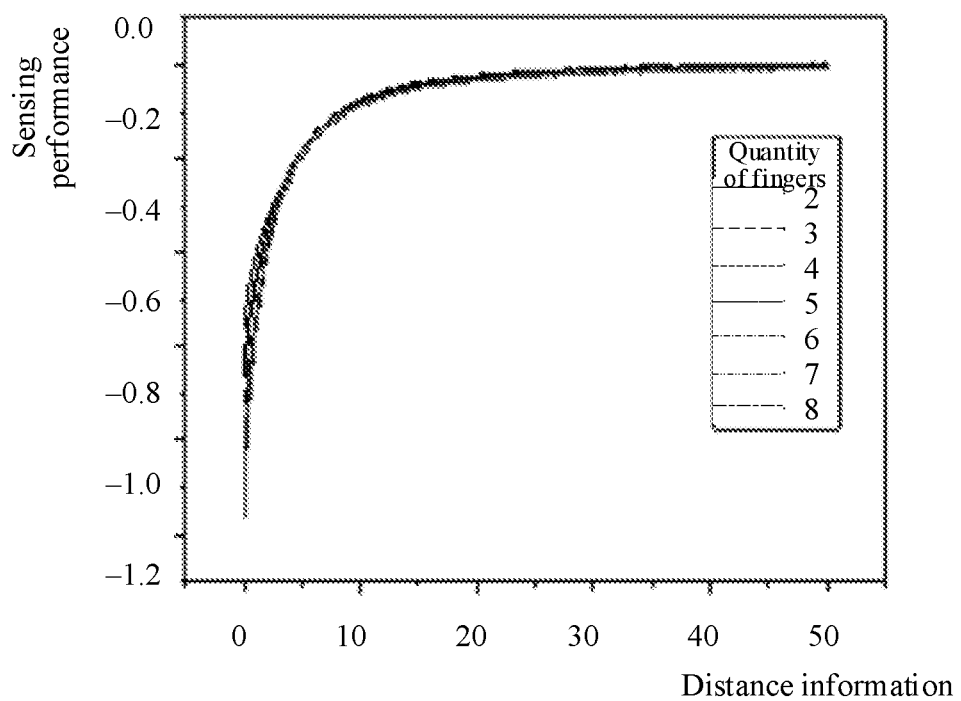
FIG. 7 is an exemplary schematic diagram illustrating a comparison curve of proximity sensing performance according to an embodiment of this disclosure.
Figure 8:
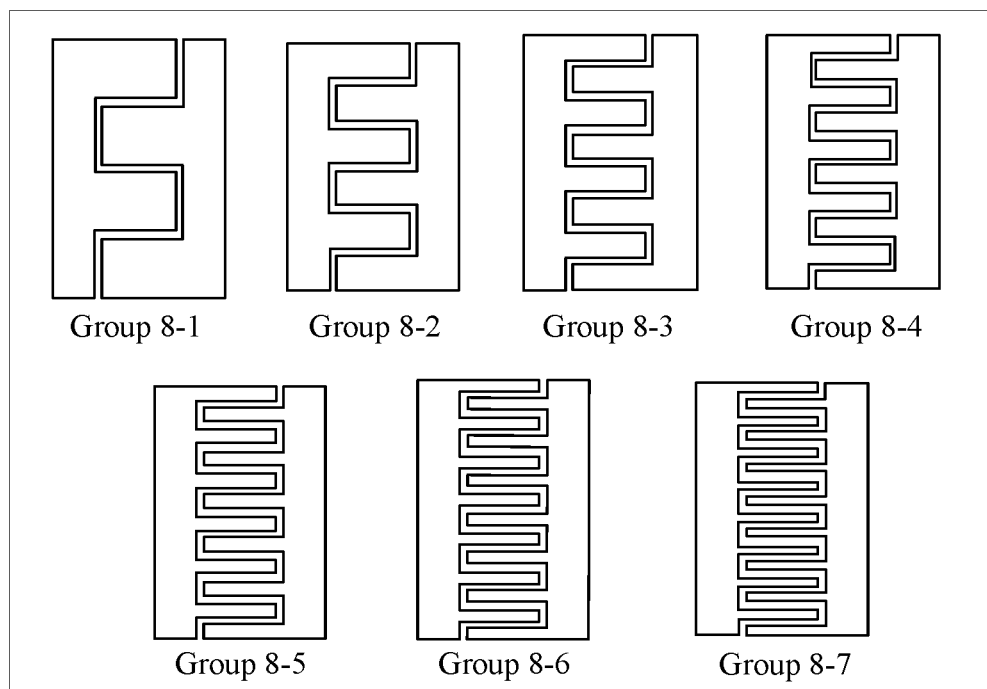
FIG. 8 is a schematic diagram illustrating two sub-upper electrodes with different quantities of electrode fingers according to an embodiment of this disclosure.
Figure 9:
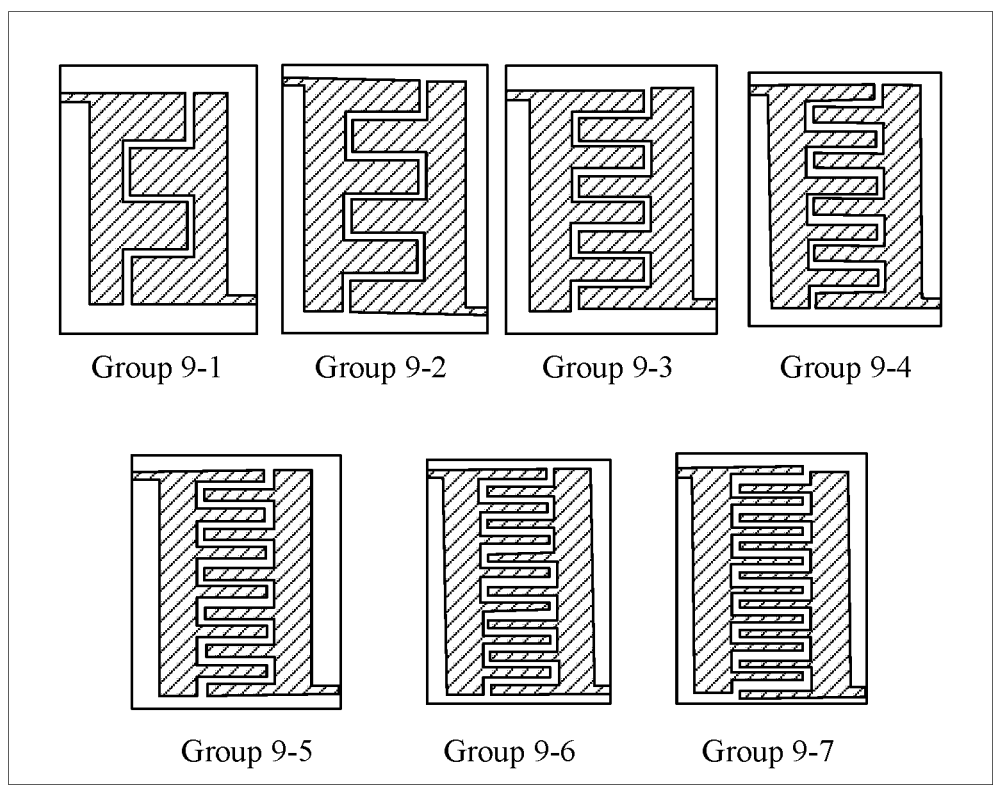
FIG. 9 is a physical schematic diagram illustrating two sub-upper electrodes with different quantities of electrode fingers according to an embodiment of this disclosure.

For example, FIG. 7 is an exemplary schematic diagram illustrating a comparison curve of proximity sensing performance according to an embodiment of this disclosure. As shown in FIG. 7, a number axis at a lower side represents distance information between the approaching object 800 and the sensor 301, and a number axis at a left side represents sensing performance of the sensor 301. It is easily known that when a quantity of electrode fingers of each sub-upper electrode 301-122 in the sensor 301 is 2, 3, 4, 5, 6, 7, and 8, respectively corresponding sensing curves are different. In addition, FIG. 8 is a schematic diagram illustrating different quantities of electrode fingers disposed for each sub-upper electrode 301-122 corresponding to FIG. 7. As shown in FIG. 8, each group of at least two sub-upper electrodes 301-12 of five groups of at least two sub-upper electrodes 301-12 are double electrodes (that is, include two sub-upper electrodes 301-122). In a group 8-1, there are two electrode fingers for each sub-upper electrode 301-122, in a group 8-2, there are three electrode fingers for each sub-upper electrode 301-122, in a group 8-3, there are four electrode fingers for each sub-upper electrode 301-122, in a group 8-4, there are five electrode fingers for each sub-upper electrode 301-122, in a group 8-5, there are six electrode fingers for each sub-upper electrode 301-122, in a group 8-6, there are seven electrode fingers for each sub-upper electrode 301-122, and in a group 8-7, there are eight electrode fingers for each sub-upper electrode 301-122. FIG. 9 is a physical diagram corresponding to FIG. 7 and FIG. 8. As shown in FIG. 9, in a group 9-1, there are two electrode fingers for each sub-upper electrode 301-122, in a group 9-2, there are three electrode fingers for each sub-upper electrode 301-122, in a group 9-3, there are four electrode fingers for each sub-upper electrode 301-122, in a group 9-4, there are five electrode fingers for each sub-upper electrode 301-122, in a group 9-5, there are six electrode fingers for each sub-upper electrode 301-122, in a group 9-6, there are seven electrode fingers for each sub-upper electrode 301-122, and in a group 9-7, there are eight electrode fingers for each sub-upper electrode 301-122.

Figure 10:
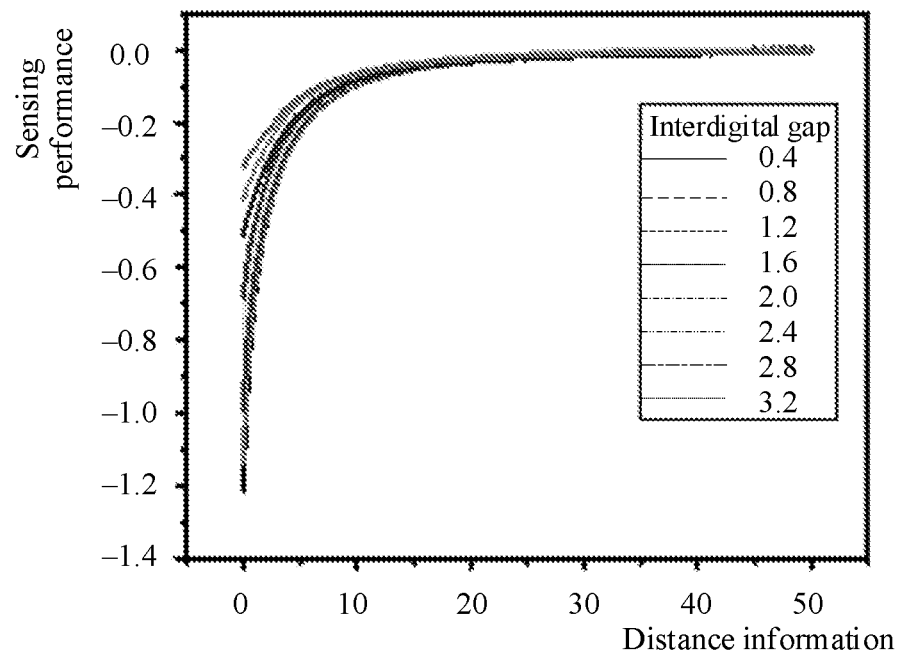
FIG. 10 is another exemplary schematic diagram illustrating a comparison curve of proximity sensing performance according to an embodiment of this disclosure.
Figure 11:
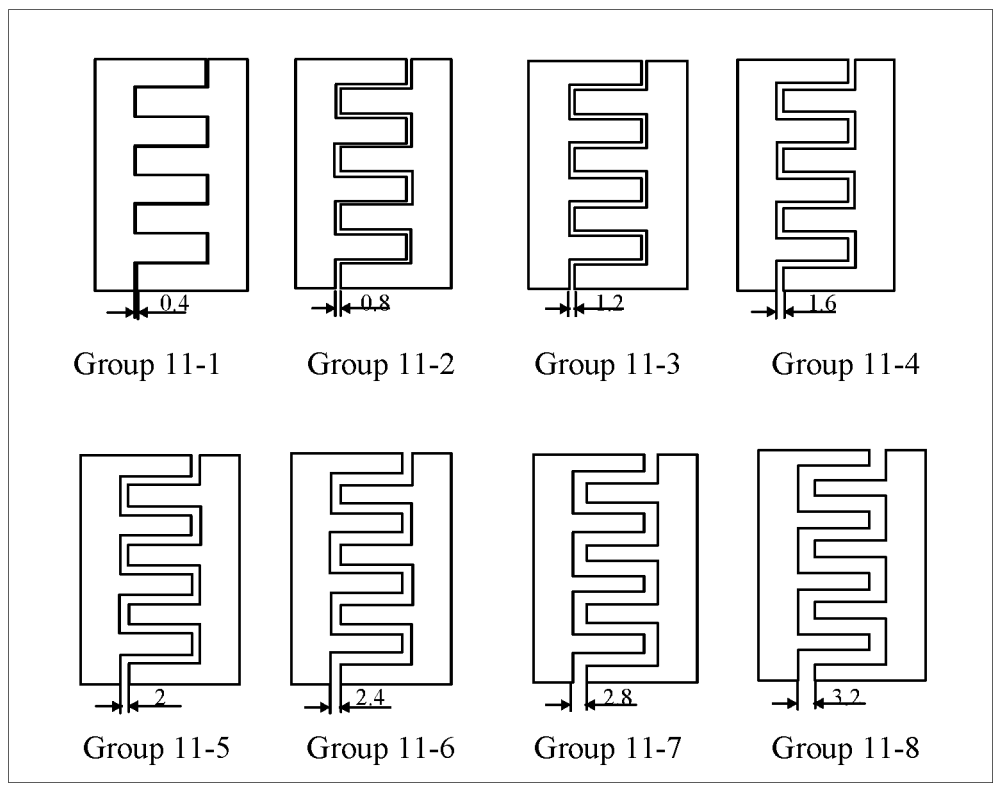
FIG. 11 is a schematic diagram illustrating two sub-upper electrodes with different interdigital gaps according to an embodiment of this disclosure.
Figure 12:
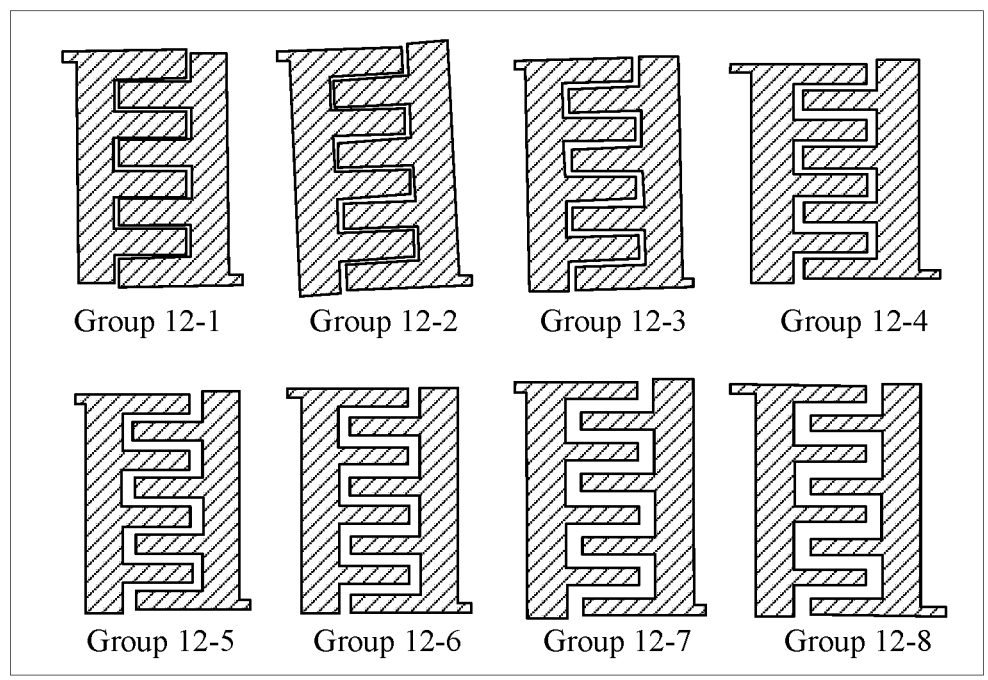
FIG. 12 is a physical schematic diagram illustrating two sub-upper electrodes with different interdigital gaps according to an embodiment of this disclosure.

For example, FIG. 10 is another exemplary schematic diagram illustrating a comparison curve of proximity sensing performance according to an embodiment of this disclosure. As shown in FIG. 10, a number axis at a lower side represents distance information between the approaching object 800 and the sensor 301, and a number axis at a left side represents sensing performance of the sensor 301. It is easily known that when an interdigital gap between the sub-upper electrodes in the sensor 301 is 0.4, 0.8, 1.2, 1.6, 2.0, 2.4, 2.8, and 3.2 (in millimeters), respectively corresponding sensing curves are different. In addition, FIG. 11 is a schematic diagram illustrating different interdigital gaps set between sub-upper electrodes corresponding to FIG. 10. As shown in FIG. 11, each group of at least two sub-upper electrodes 301-12 of five groups of at least two sub-upper electrodes 301-12 are double electrodes. In a group 11-1, an interdigital gap between the sub-upper electrodes 301-122 is 0.4, in a group 11-2, an interdigital gap between the sub-upper electrodes 301-122 is 0.8, in a group 11-3, an interdigital gap between the sub-upper electrodes 301-122 is 1.2, in a group 11-4, an interdigital gap between the sub-upper electrodes 301-122 is 1.6, in a group 11-5, an interdigital gap between the sub-upper electrodes 301-122 is 2.0, in a group 11-6, an interdigital gap between the sub-upper electrodes 301-122 is 2.4, in a group 11-7, an interdigital gap between the sub-upper electrodes 301-122 is 2.8, and in a group 11-8, an interdigital gap between the sub-upper electrodes 301-122 is 3.2. FIG. 12 is a physical diagram corresponding to FIG. 10 and FIG. 11. As shown in FIG. 12, in a group 12-1, an interdigital gap between the sub-upper electrodes 301-122 is 0.4, in a group 12-2, an interdigital gap between the sub-upper electrodes 301-122 is 0.8, in a group 12-3, an interdigital gap between the sub-upper electrodes 301-122 is 1.2, in a group 12-4, an interdigital gap between the sub-upper electrodes 301-122 is 1.6, in a group 12-5, an interdigital gap between the sub-upper electrodes 301-122 is 2.0, in a group 12-6, an interdigital gap between the sub-upper electrodes 301-122 is 2.4, in a group 12-7, an interdigital gap between the sub-upper electrodes 301-122 is 2.8, and in a group 12-8, an interdigital gap between the sub-upper electrodes 301-122 is 3.2.

Figure 13:
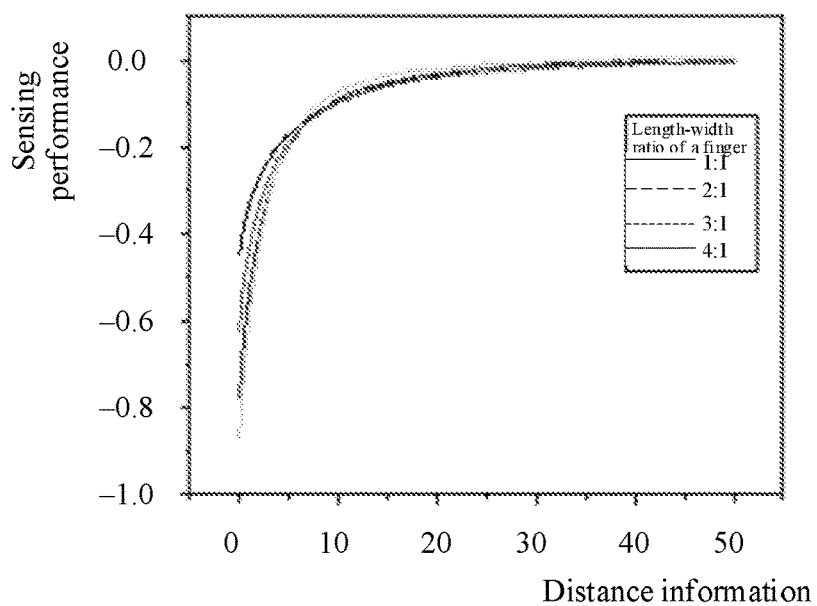
FIG. 13 is another exemplary schematic diagram illustrating a comparison curve of proximity sensing performance according to an embodiment of this disclosure.
Figure 14:
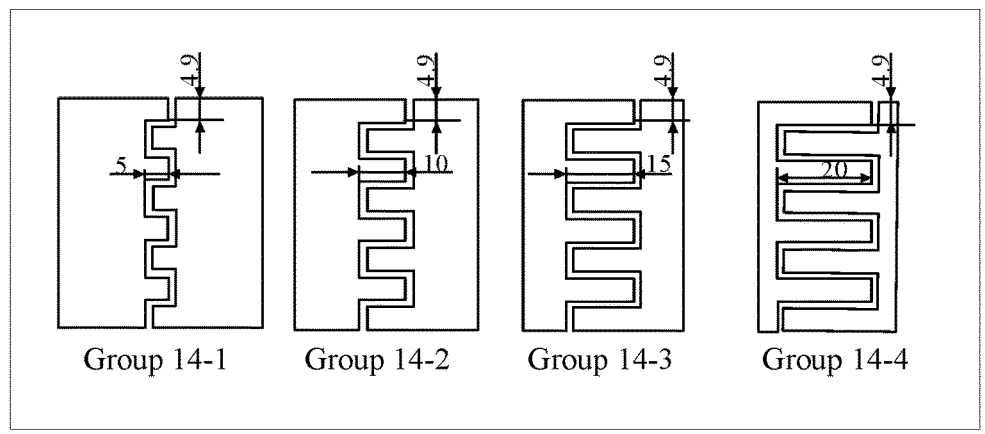
FIG. 14 is a schematic diagram illustrating two sub-upper electrodes with different length-width ratios according to an embodiment of this disclosure.
Figure 15:
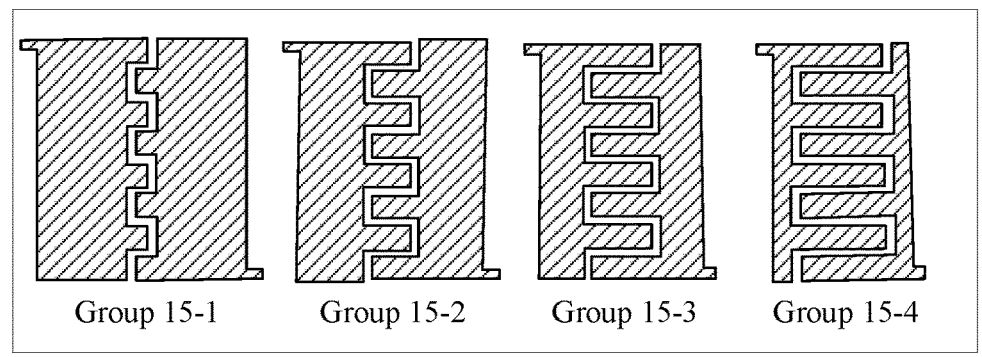
FIG. 15 is a physical schematic diagram illustrating two sub-upper electrodes with different length-width ratios according to an embodiment of this disclosure.

For example, FIG. 13 is still another exemplary schematic diagram illustrating a comparison curve of proximity sensing performance according to an embodiment of this disclosure. As shown in FIG. 13, a number axis at a lower side represents distance information between the approaching object 800 and the sensor 301, and a number axis at a left side represents sensing performance of the sensor 301. It is easily known that a length-width ratio of an electrode finger of each sub-upper electrode in the sensor 301 is "1:1", "2:1", "3:1", and "4:1", corresponding sensing curves are different. In addition, FIG. 14 is a schematic diagram illustrating different length-width ratios set for each sub-upper electrode corresponding to FIG. 13. As shown in FIG. 14, each group of at least two sub-upper electrodes 301-12 of five groups of at least two sub-upper electrodes 301-12 are double electrodes. In a group 14-1, a length-width ratio of an electrode finger of each sub-upper electrode 301-122 is "5:4.9" (that is, "1:1"), in a group 14-2, a length-width ratio of an electrode finger of each sub-upper electrode 301-122 is "10:4.9" (that is, "2:1"), in a group 14-3, a length-width ratio of an electrode finger of each sub-upper electrode 301-122 is "15:4.9" (that is, "3:1"), and in a group 14-4, a length-width ratio of an electrode finger of each sub-upper electrode 301-122 is "20:4.9" (that is, "4:1"). FIG. 15 is a physical diagram corresponding to FIG. 13 and FIG. 14. As shown in FIG. 15, in a group 15-1, a length-width ratio of an electrode finger of each sub-upper electrode 301-122 is "5:4.9" (that is, "1:1"), in a group 15-2, a length-width ratio of an electrode finger of each sub-upper electrode 301-122 is "10:4.9" (that is, "2:1"), in a group 15-3, a length-width ratio of an electrode finger of each sub-upper electrode 301-122 is "15:4.9" (that is, "3:1"), and in a group 15-4, a length-width ratio of an electrode finger of each sub-upper electrode 301-122 is "20:4.9" (that is, "4:1").

In this embodiment of this disclosure, when each sub-upper electrode 301-122 in the sensor 301 is a circular electrode, the at least two sub-upper electrodes 301-12 are coplanar and concentric. A coplanar disposition manner includes a different-plane disposition and a same-plane disposition.

The at least two sub-upper electrodes 301-12 are coplanar, and the two sub-upper electrodes 301-12 are concentric, so that an out-of-plane closed electric field is formed.

Figure 16:
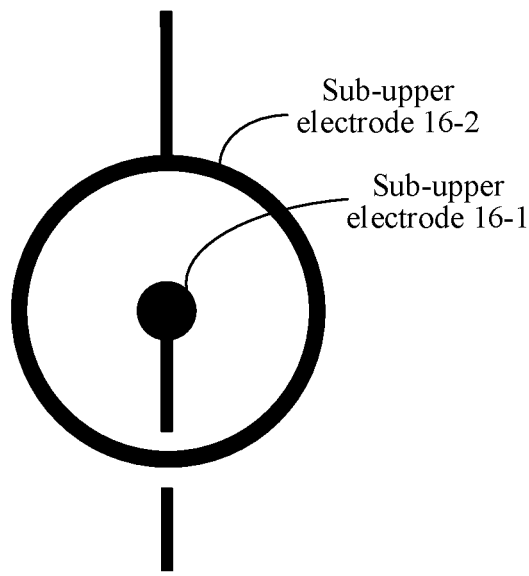
FIG. 16 is another exemplary schematic diagram illustrating disposition of two sub-upper electrodes according to an embodiment of this disclosure.

For example, FIG. 16 is another exemplary schematic diagram illustrating disposition of two sub-upper electrodes according to an embodiment of this disclosure. As shown in FIG. 16, two circular electrodes (the at least two sub-upper electrodes 301-12), that is, a sub-upper electrode 16-1 and a sub-upper electrode 16-2, are coplanar and concentric.

Herein, a coplanar manner between two sub-upper electrodes 301-12 and a circular size of the sub-upper electrode are both related to the proximity sensing performance of the sensor 301. In an actual application, the coplanar manner between the two sub-upper electrodes 301-12 and the circular size of the sub-upper electrode may be set according to actual requirements.

Figure 17:
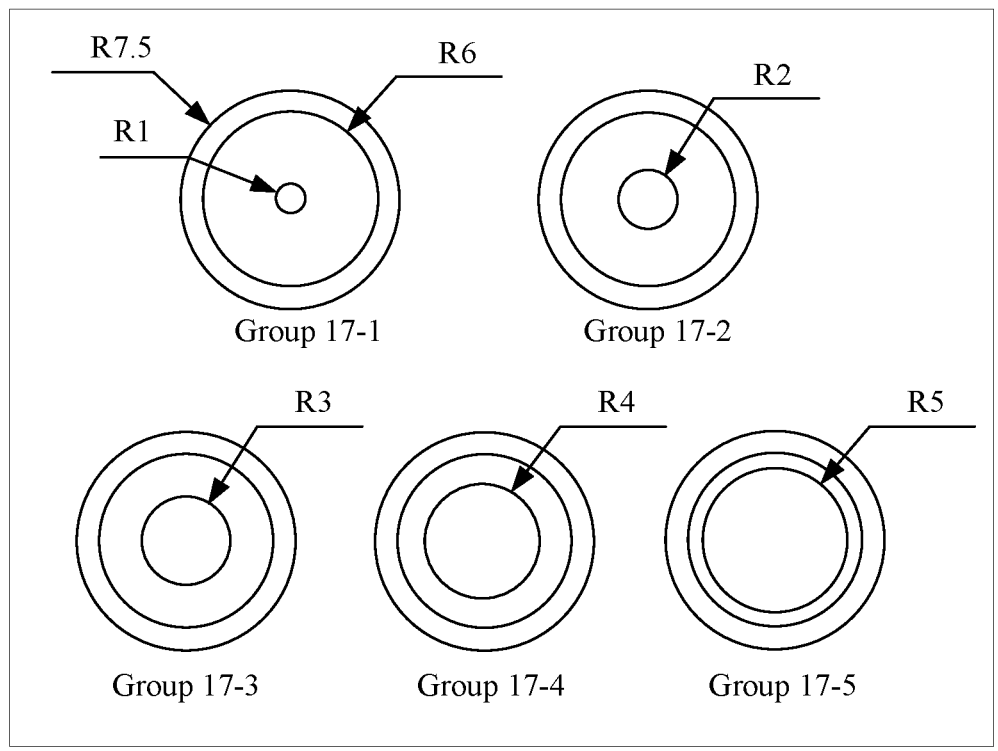
FIG. 17 is an exemplary schematic diagram illustrating disposition of two sub-upper electrodes according to an embodiment of this disclosure.
Figure 18:
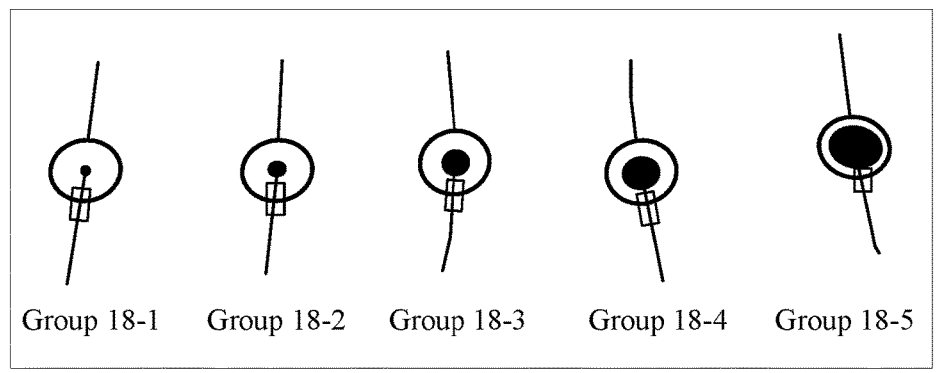
FIG. 18 is an exemplary schematic diagram in which two sub-upper electrodes are coplanar in a same plane according to an embodiment of this disclosure.
Figure 19:
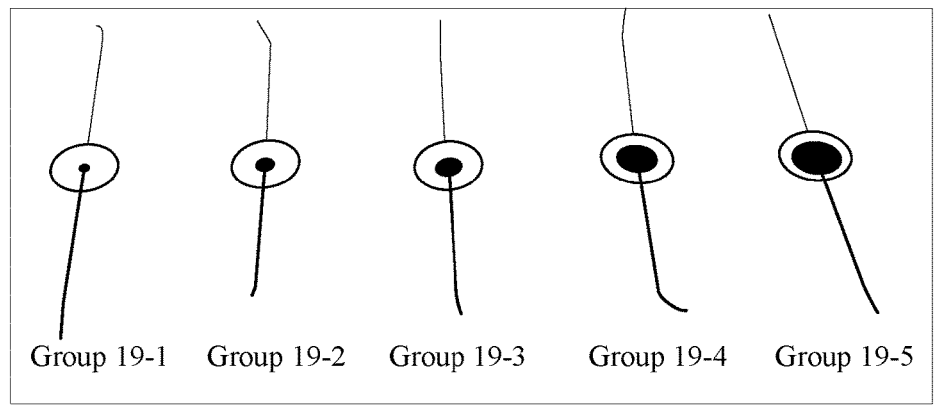
FIG. 19 is an exemplary schematic diagram in which two sub-upper electrodes are coplanar in different planes according to an embodiment of this disclosure.

For example, FIG. 17 is an exemplary schematic diagram illustrating disposition of at least two sub-upper electrodes according to an embodiment of this disclosure. As shown in FIG. 17, each group of at least two sub-upper electrodes 301-12 of five groups of at least two sub-upper electrodes 301-12 are double electrodes, and each sub-upper electrode in the double electrodes is a circular electrode. A radius of an external circle of one electrode (a sub-upper electrode) of the double electrodes is R7.5, and a radius of an inner circle is R6, and radii of the other electrodes (sub-upper electrodes) in a group 17-1, a group 17-2, a group 17-3, a group 17-4, and a group 17-5 are R1, R2, R3, R4, and R5 sequentially. FIG. 18 is a schematic diagram in which five groups of double electrodes are disposed in a same plane. A group 18-1 corresponds to the group 17-1, a group 18-2 corresponds to the group 17-2, a group 18-3 corresponds to the group 17-3, a group 18-4 corresponds to the group 17-4, and a group 18-5 corresponds to the group 17-5. FIG. 19 is a physical diagram in which five groups of double electrodes are disposed in different planes in FIG. 7 and five groups of double electrodes are disposed in a same plane in FIG. 18. A group 19-1 respectively corresponds to the group 18-1 and the group 17-1, a group 19-2 respectively corresponds to the group 18-2 and the group 17-2, a group 19-3 respectively corresponds to the group 18-3 and the group 17-3, a group 19-4 respectively corresponds to the group 18-4 and the group 17-4, and a group 19-5 respectively corresponds to the group 18-5 and the group 17-5

In this embodiment of this disclosure, the dielectric layer 301-2 of the sensor 301 is an ionic gel dielectric layer or an insulating material thin film dielectric layer.

The ionic gel dielectric layer is a dielectric layer made of ionic gel and has an ion sensing characteristic, so that the sensor 301 is an ionic capacitive tactile sensor. The insulating material thin film dielectric layer is a dielectric layer made of an insulating material thin film (for example, a polymer thin film), so that the sensor 301 is a direct capacitance tactile sensor.

In this embodiment of this disclosure, when the dielectric layer 301-2 is the ionic gel dielectric layer, the ionic gel dielectric layer has a microstructure, and under the action of the microstructure of the ionic gel dielectric layer, second capacitance information between the upper electrode layer 301-1 and the lower electrode layer 301-3 is determined according to a contact area between the upper electrode layer 301-1 and the ionic gel dielectric layer and a contact area between the lower electrode layer 301-3 and the ionic gel dielectric layer.

When the dielectric layer 301-2 is the ionic gel dielectric layer, a contact sensing principle of the sensor 301 is that freely movable ions exist in the dielectric layer 301-2, and the ions move to the upper electrode layer 301-1 and the lower electrode layer 301-3 under the action of the electric field, so that a micro-capacitance is formed between the upper electrode layer 301-1, the lower electrode layer 301-3, and the dielectric layer 301-2, that is, a double-layer capacitance is formed. Moreover, because the dielectric layer 301-2 (for example, a surface of the dielectric layer or the entire dielectric layer) has a microstructure, in the double-layer capacitance, a contact area between the upper electrode layer 301-1 and the dielectric layer 301-2 (which is the ionic gel dielectric layer) and a contact area between the lower electrode layer 301-3 and the dielectric layer are gradually increased under pressure, so that a capacitance value between the upper electrode layer 301-1 and the lower electrode layer 301-3 is increased, to sense an acting force acting on a contact object, thereby completing contact sensing. In addition, the capacitance value between the upper electrode layer 301-1 and the lower electrode layer 301-3 is usually inversely proportional to a distance between the upper electrode layer 301-1 and the lower electrode layer 301-3, and a distance between the upper electrode layer 301-1 and the dielectric layer 301-2 and a distance between the lower electrode layer 301-3 and the dielectric layer are generally at a nanometer level. Therefore, the sensor 301 has high sensitivity to contact sensing of a force.

That is, the surface of the dielectric layer 301-2 or the entire dielectric layer has the microstructure. Before the acting force is applied, a contact area of an electrode-electrolyte interface between the upper electrode layer 301-1 and the dielectric layer 301-2 and a contact area of an electrode-electrolyte interface between the lower electrode layer 301-3 and the dielectric layer are small. After a touch pressure is applied, due to deformation of the microstructure, the contact area of the electrode-electrolyte interface between the upper electrode layer 301-1 and the dielectric layer 301-2 and the contact area of the electrode-electrolyte interface between the lower electrode layer 301-3 and the dielectric layer are increased. Moreover, because a distance d between the upper electrode layer 301-1 and the dielectric layer 301-2 and a distance d between the lower electrode layer 301-3 and the dielectric layer are at the nanometer level, the capacitance value of the sensor 301 increase rapidly with the increase of the contact area S and the sensor has the high sensitivity.

For example, the capacitance value between the upper electrode layer 301-1 and the lower electrode layer 301-3 may be implemented by using formula (1). Formula (1) is as follows.

$$C = \frac{\varepsilon S}{4\pi k d} \quad (1)$$

where C represents the capacitance value between the upper electrode layer 301-1 and the lower electrode layer 301-3, ε represents a dielectric constant, S represents the contact area between the upper electrode layer 301-1 and the dielectric layer 301-2 and the contact area between the lower electrode layer 301-3 and the dielectric layer, k is an electrostatic force constant, and d is the distance between the upper electrode layer 301-1 and the dielectric layer 301-2 and the distance between the lower electrode layer 301-3 and the dielectric layer. Generally, the upper electrode layer 301-1 right faces the lower electrode layer 301-3, an electric field between the upper electrode layer and the lower electrode layer is approximated as a parallel electric field, and £ and k are not changed. When the dielectric layer 301-2 of the sensor 301 is the ionic gel dielectric layer, d is not changed, and C increases with the increase of S.

In this embodiment of this disclosure, when the dielectric layer 301-2 is an insulating material thin film dielectric layer, the insulating material thin film dielectric layer has a microstructure, and under the action of the microstructure of the insulating material thin film dielectric layer, the second capacitance information between the upper electrode layer 301-1 and the lower electrode layer 301-3 is determined according to a distance between the upper electrode layer 301-1 and the insulating material thin film dielectric layer and a distance between the lower electrode layer 301-3 and the insulating material thin film dielectric layer.

The distance between the upper electrode layer 301-1 and the dielectric layer 301-2 and the distance between the lower electrode layer 301-3 and the dielectric layer are changed (decreased) under pressure, so that the capacitance value between the upper electrode layer 301-1 and the lower electrode layer 301-3 is increased, to sense the acting force acting on the contact object, thereby completing contact sensing. Herein, similarly, formula (1) is used, the upper electrode layer 301-1 right faces the lower electrode layer 301-3, the electric field between the upper electrode layer and the lower electrode layer is the parallel electric field, and S, E, and k are not changed. Under the action of the microstructure of the dielectric layer 301-2 (for example, the surface of the dielectric layer or the entire dielectric layer), the capacitance value C between upper electrode layer 301-1 and the lower electrode layer 301-3 increases as the distance between the upper electrode layer 301-1 and the dielectric layer 301-2 and the distance between the lower electrode layer 301-3 and the dielectric layer decrease.

Figure 20:
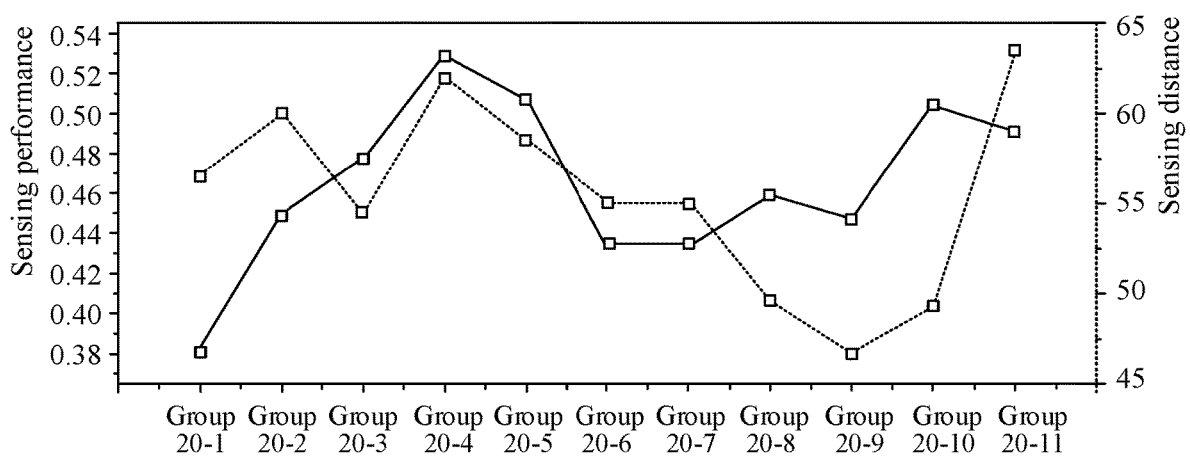
FIG. 20 is an exemplary schematic diagram illustrating comparison between sensitivities of a sensor according to an embodiment of this disclosure.

For example, FIG. 20 is an exemplary schematic diagram illustrating comparison between sensitivities of a sensor according to an embodiment of this disclosure. FIG. 20 shows information about sensing performance corresponding to different structures and sizes of double electrodes (at least two sub-upper electrodes) in an upper electrode layer.

A number axis at a left side is sensing performance, a number axis at a right side is a sensing distance, and a number axis at a lower side is a structure and a size of each sub-upper electrode. The structure includes circular electrodes in a same plane or in different planes, and the circular electrodes correspond to different radii (R1, R2, R3, R4, and R5 shown in FIG. 17), or the double electrodes are interdigital electrodes. Herein, a dashed line represents sensing distance information and a solid line represents sensing performance. In FIG. 20, each group of at least two sub-upper electrodes 301-12 of 11 groups of at least two sub-upper electrodes 301-12 are double electrodes. Two sub-upper electrodes 301-122 in any group from a group 20-1 to a group 20-5 are circular electrodes disposed in different planes, a radius of an external circle of one of the two sub-upper electrodes is R7.5, and a radius of an inner circle is R6, and radii of the other sub-upper electrodes in the group 20-1 to the group 20-5 are R1, R2, R3, R4, and R5 sequentially. Two sub-upper electrodes 301-122 in any group from a group 20-6 to a group 20-10 are circular electrodes disposed in the same plane, a radius of an external circle of one of the two sub-upper electrodes is R7.5, and a radius of an inner circle is R6, and radii of the other sub-upper electrodes in the group 20-6 to the group 20-10 are R1, R2, R3, R4, and R5 sequentially. Both two sub-upper electrodes 301-12 in a group 21 are interdigital electrodes. It is easily known that different structures and sizes of at least two sub-upper electrodes correspond to different sensing performance and sensing distances.

Figure 21:
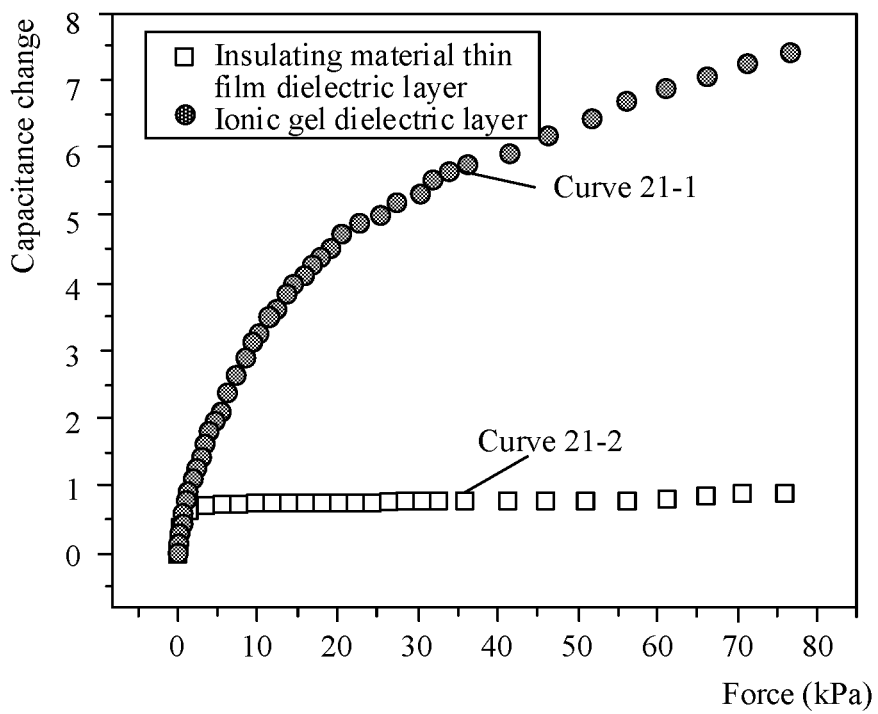
FIG. 21 is an exemplary schematic diagram illustrating capacitance change curves corresponding to dielectric layers of different materials under the action of a force according to an embodiment of this disclosure.

In addition, sensing performance of the sensor 301 corresponding to the ionic gel dielectric layer is higher than sensing performance of the sensor 301 corresponding to the insulating material thin film dielectric layer. FIG. 21 is an exemplary schematic diagram illustrating capacitance change curves corresponding to dielectric layers of different materials under the action of a force according to an embodiment of this disclosure. As shown in FIG. 21, a capacitance of the ionic gel dielectric layer increases with the increase of a force, as shown in a curve 21-1. A capacitance of the insulating material thin film dielectric layer changes slowly with the increase of the force, as shown in a curve 21-2. Therefore, it indicates that the sensing performance of the sensor 301 corresponding to the ionic gel dielectric layer is higher than the sensing performance of the sensor 301 corresponding to the insulating material thin film dielectric layer.

In this embodiment of this disclosure, the lower electrode layer 301-3 of the sensor 301 is a conductive thin film electrode layer.

The conductive thin film electrode layer is an electrode layer made of a conductive thin film. Herein, the conductive thin film is, for example, a metal foil, a metal coating thin film, or a carbon cloth, and the metal foil is, for example, a copper foil, a gold foil, or a silver foil.

Figure 22:
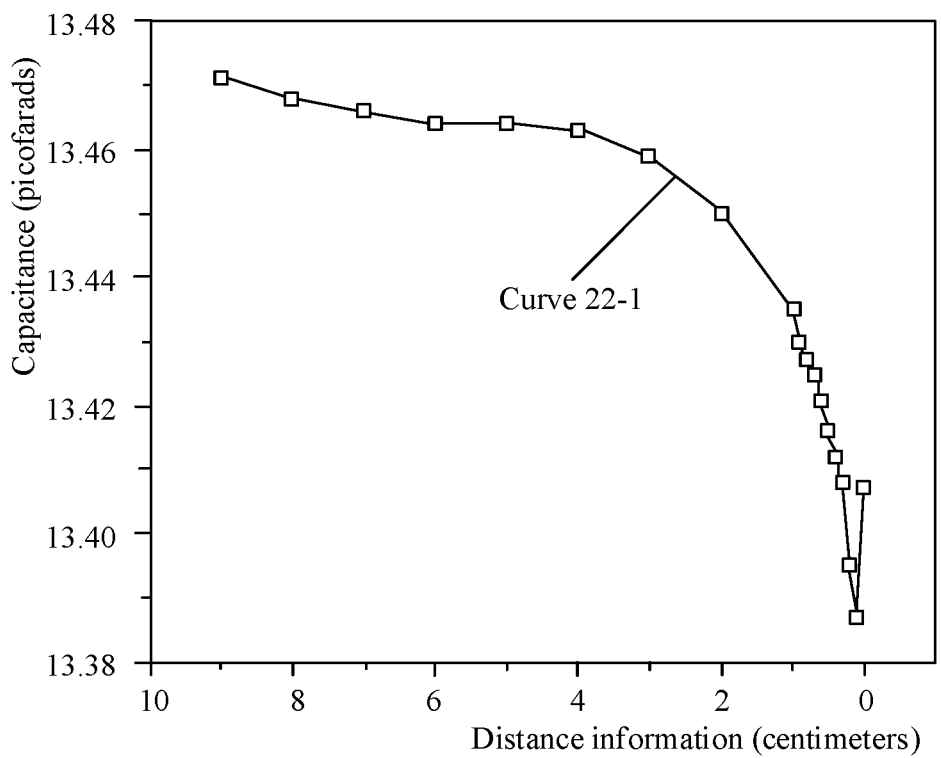
FIG. 22 is an exemplary schematic diagram illustrating a proximity sensing curve of a sensor to an insulator according to an embodiment of this disclosure.
Figure 23:
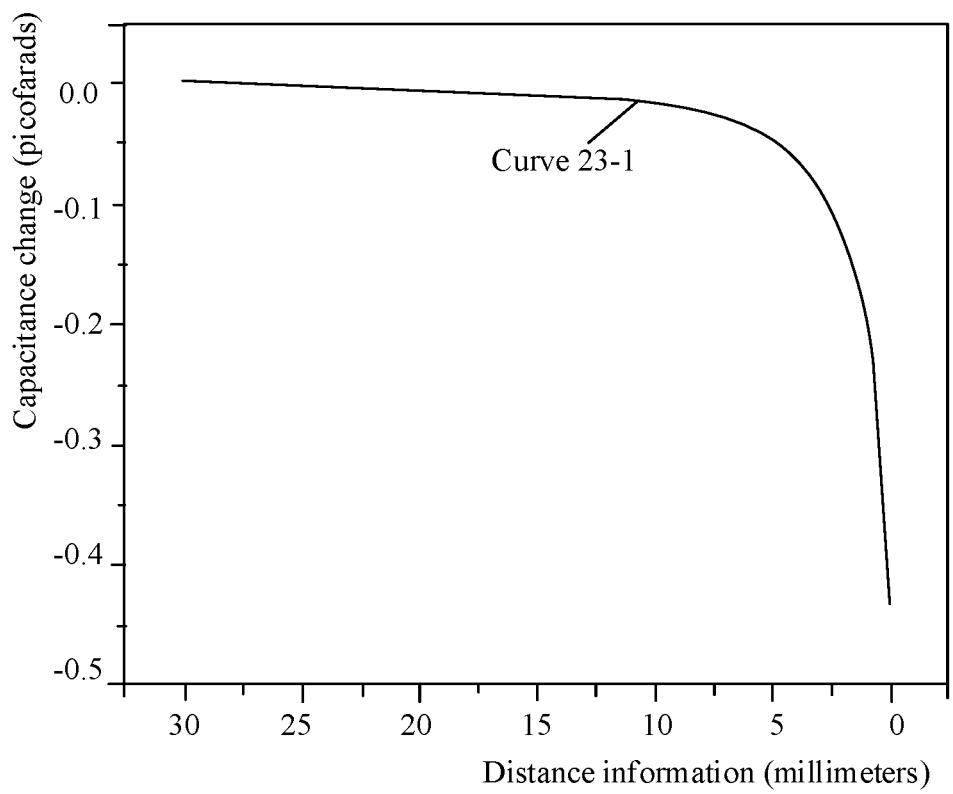
FIG. 23 is an exemplary schematic diagram illustrating a proximity sensing curve of a sensor to a conductor according to an embodiment of this disclosure.

In this embodiment of this disclosure, the sensor 301 can perform proximity sensing on any object. For example, FIG. 22 is a schematic diagram illustrating a proximity sensing curve of a sensor to an insulator and FIG. 23 is a schematic diagram illustrating a proximity sensing curve of sensor to a conductor. As shown in a curve 22-1 in FIG. 22, when the sensor 301 performs proximity sensing on an insulator, the first capacitance information (capacitance, in picofarads) of the sensor 301 gradually decreases as the sensor approaches the insulator (distance information, in centimeters). As shown in a curve 23-1 in FIG. 23, when the sensor 301 performs proximity sensing on a conductor, capacitance change information (capacitance change, in picofarads) of the sensor 301 gradually decreases as the sensor approaches the conductor (distance information, in millimeters).

It may be understood that the sensor provided in this embodiment of this disclosure combines a function of a proximity sensor and a function of a tactile sensor and can implement two sensing levels of proximity sensing and contact sensing. In addition, in the sensor, an electrode is made of a flexible conductive material, a flexible material thin film is used for a substrate of the electrode, and a flexible sensing active material is used for the sensor, so that the overall flexibility of the sensor is achieved. Therefore, the sensor can be bent, stretched, and deformed to a certain extent as a whole, and can maintain the stability of the sensing performance. Therefore, the sensor provided in this embodiment of this disclosure has a simple system, is convenient to manufacture, can be directly attached or fixed to another device without damaging a structure of the another device, does not require an additional design, has multiple sensing levels, and is stable and accurate.

Still referring to FIG. 1, an embodiment of this disclosure further provides an intelligent device 200, including: a controller 400; and a sensor array 300 connected to the controller 400. Each sensor 301 in the sensor array 300 is the foregoing sensor.

Figure 24:
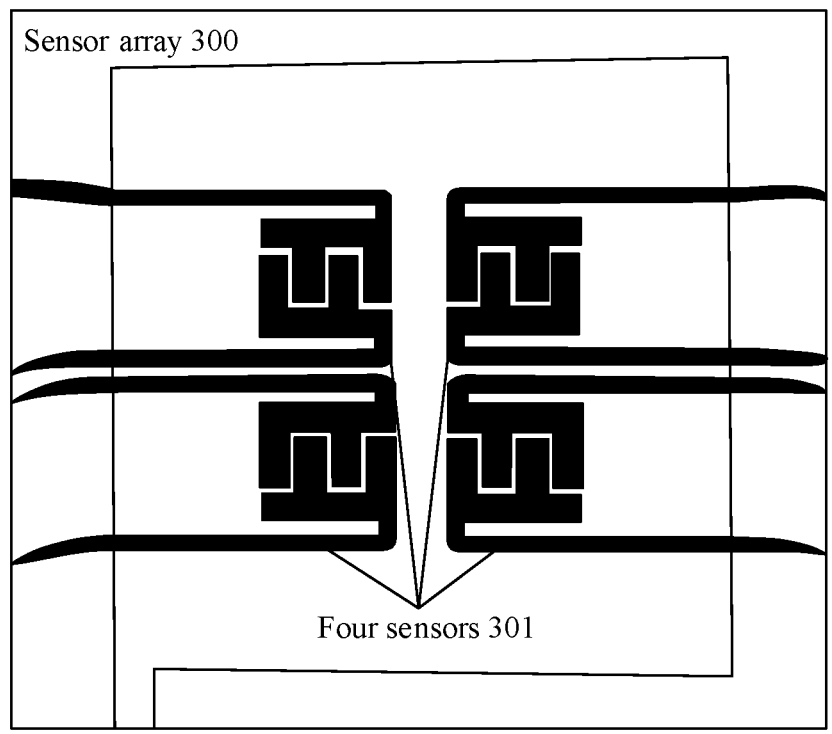
FIG. 24 is an exemplary sensor array according to an embodiment of this disclosure.

The sensors 301 in this embodiment of this disclosure are arranged in an array, to obtain the sensor array 300, for example, FIG. 24 shows a sensor array 300 formed by four sensor 301. The sensor array 300 is attached to a housing of the intelligent device 200 as a flexible skin of the intelligent device 200, and the sensor array 300 is connected to the controller 400 of the intelligent device 200, so that a sensing signal of each sensor 301 in the sensor array 300 is obtained by using the controller 400, to implement multi-functional and accurate sensing on a target object.

For example, the sensor array 300 may be attached to an outer surface of a robot in a large area, and the sensor array 300 is connected to a processing apparatus (the controller) of the robot, to obtain the intelligent device 200 in this embodiment of this disclosure. Therefore, omnidirectional sensing of parts of the robot to the outside can be implemented, and the robot can determine a specific position of an approaching object by using the high-density sensor array 300, thereby indeed achieving complete warning of the robot for a working environment. When an object is approaching, the robot can sense the object and avoid the object or reduce a speed, and after the robot is in contact with the object, the robot can sense a pressure between the object and the robot, to avoid damage caused by excessively large pressure carried by or applied by the robot. In addition, the sensor array 300 may be on a region with a relatively large area of the robot, for example, a cylindrical outer wall of the arm and the front chest or back of the robot trunk, to implement high-density object distance sensing in the relatively large area. The robot can sense a position of the object accurately by using the high-density sensor array, thereby avoiding collision between the robot and a surrounding object. After being in contact with the object, the high-density sensor array can sense contact pressures at different positions, to avoid damage on the robot caused by excessively large local pressure. In addition, the sensor array 300 may alternatively be attached to a narrow part or a tip such as a finger of the robot. According to specific situations, a single sensor or a simple sensor array is designed for sensing, so that the robot actively senses the object during operation and takes a braking or avoiding action in time, to prevent a finger from colliding during work, and may take a flexible operation to make motion planning in advance when sensing an object that needs to be grabbed before contact. In addition, a magnitude of a grabbing force is sensed when the finger grabs the object, and a proper force is intelligently applied to grab, to avoid damage to the to-be-grabbed object.

Figure 25:
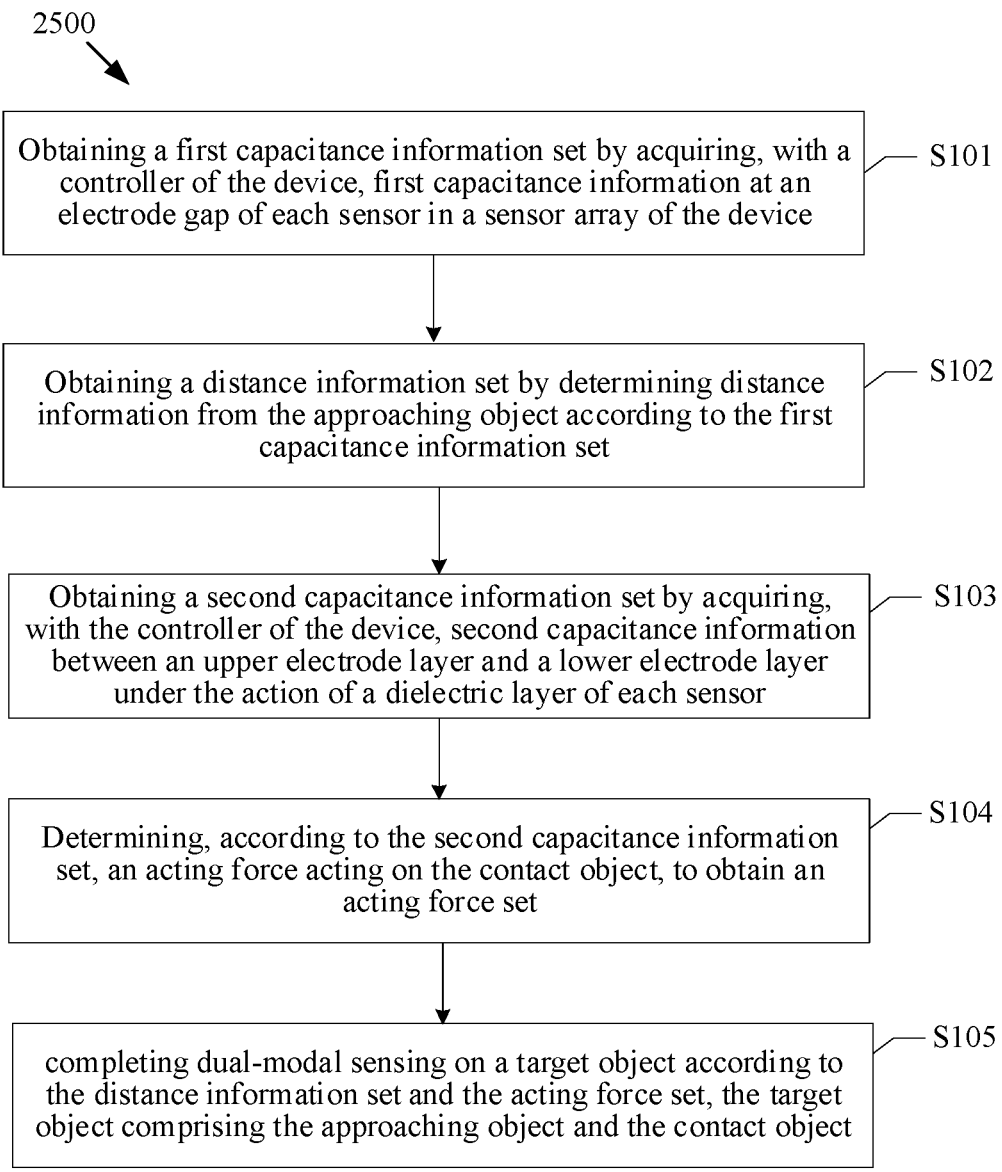
FIG. 25 is an exemplary schematic flowchart of a sensing method according to an embodiment of this disclosure.

Correspondingly, FIG. 25 is an exemplary schematic flowchart of a sensing method 2500 according to an embodiment of this disclosure, which corresponds to the intelligent device 200. A description is made below with reference to steps shown in FIG. 25.

S101. Acquire first capacitance information at an electrode gap of each sensor in a sensor array of an intelligent device by using a controller when an approaching object approaches the intelligent device, to obtain a first capacitance information set.

In this embodiment of this disclosure, when a distance between an approaching object and an intelligent device decreases, that is, the approaching object approaches the intelligent device, because each sensor includes an upper electrode layer formed by at least two sub-upper electrodes, the intelligent device obtains first capacitance information at an electrode gap of each sensor in a sensor array by using a controller, to obtain a first capacitance information set corresponding to the sensor array. Herein, the electrode gap is a gap between the at least two sub-upper electrodes, and the first capacitance information set is a set formed by first capacitance information at electrode gaps corresponding to sensors.

S102. Determine distance information from the approaching object according to the first capacitance information set, to obtain a distance information set.

In this embodiment of this disclosure, each sensor in the sensor array is marked. Therefore, the intelligent device can obtain distance information between each sensor and the approaching object according to the first capacitance information set, to obtain a distance information set. Herein, the distance information in the distance information set is in a one-to-one correspondence with the first capacitance information in the first capacitance information set.

S103. Acquire second capacitance information between an upper electrode layer and a lower electrode layer under the action of a dielectric layer of each sensor by using the controller when the intelligent device acts on a contact object, to obtain a second capacitance information set.

Each sensor in the sensor array of the intelligent device is formed by connecting an upper electrode layer and a lower electrode layer to two sides of a dielectric layer. Therefore, when the intelligent device interacts with a contact object (for example, the intelligent device bears the contact object), second capacitance information between the upper electrode layer and the lower electrode layer can be obtained under the action of the dielectric layer of each sensor in the sensor array, to obtain a second capacitance information set corresponding to the sensor array. Herein, the second capacitance information set is a set formed by second capacitance information between upper electrode layers and lower electrode layers corresponding to the sensors.

S104. Determine, according to the second capacitance information set, an acting force acting on the contact object, to obtain an acting force set.

In this embodiment of this disclosure, each sensor in the sensor array is marked. Therefore, the intelligent device can obtain acting forces of the sensors on the contact object according to the second capacitance information set, to obtain an acting force set. Herein, the acting force in the acting force set is in a one-to-one correspondence with the second capacitance information in the second capacitance information set.

S105. Complete dual-modal sensing on a target object according to the distance information set and/or the acting force set, the target object including the approaching object and the contact object.

The intelligent device can determine a target approaching distance according to the distance information set, that is, complete proximity sensing on the approaching object. Herein, the target approaching distance refers to distance information of the approaching object relative to all directions of the intelligent device. The intelligent device can determine a target acting force of the contact object according to the acting force set, that is, complete contact sensing on the contact object. Herein, the target acting force is an acting force of the contact object relative to all the directions of the intelligent device. In this case, the intelligent device completes dual-modal sensing on a target object, the target object including the approaching object and the contact object.

In this embodiment of this disclosure, the intelligent device may further determine a subsequent processing operation according to the target approaching distance and/or the target acting force. For example, when the target approaching distance indicates that a distance between the intelligent device and the approaching object is relatively short, the intelligent device performs avoiding. In another example, when the target acting force indicates that an acting force acting on the contact object by the intelligent device is too large, the acting force is reduced, and a flexible operation is achieved The following describes an exemplary application of this embodiment of this disclosure in an actual application scenario.

Example 1. First, a conductive carbon cloth with bending performance is selected as an electrode material, the conductive carbon cloth is cut into a size of an electrode by using a laser, to obtain double electrodes (at least two sub-upper electrodes) of an upper electrode layer, each electrode (each sub-upper electrode) of the double electrodes being an interdigital electrode, and one surface (a second sub-upper electrode surface) of the double electrodes is attached to a polymer thin film (a first encapsulation layer).

Subsequently, a capacitance sensing active material with an ion sensing characteristic is selected as a dielectric layer, an ionic gel dielectric layer is obtained through processing, a surface of the ionic gel dielectric layer or the entire ionic gel dielectric layer having a microstructure, and one surface (a first dielectric layer surface) of the ionic gel dielectric layer is attached to the other surface (a first sub-upper electrode surface) of the double electrodes.

Next, a copper foil is selected as a lower electrode layer, and one surface (a first lower electrode surface) of the copper foil is attached to the other surface (a second dielectric layer surface) of the ionic gel dielectric layer. Herein, the copper foil is also used as a shield layer of the upper electrode layer, to shield electric field interference inside the robot (the intelligent device).

Finally, the other surface (a second lower electrode surface) of the copper foil is also attached to the polymer thin film (a second encapsulation layer). In this case, a flexible robot skin capable of performing high-sensitivity dual-modal sensing.

Example 2. First, a conductive carbon cloth with bending performance is selected as an electrode material, and the conductive carbon cloth is cut into a size of an electrode by using a laser, to obtain double electrodes (at least two sub-upper electrodes) of an upper electrode layer. Each electrode (each sub-upper electrode) of the double electrodes is a circular electrode, the double electrodes are coplanar on the upper electrode layer and concentric, that is, each electrode is designed into a concentric circle, and one surface (a second sub-upper electrode surface) of the double electrode is attached to a polymer thin film (a first encapsulation layer).

Subsequently, a capacitance sensing active material with an ion sensing characteristic is selected as a dielectric layer, an ionic gel dielectric layer is obtained through processing, a surface of the ionic gel dielectric layer or the entire ionic gel dielectric layer having a microstructure, and one surface (a first dielectric layer surface) of the ionic gel dielectric layer is attached to the other surface (a first sub-upper electrode surface) of the double electrodes.

Next, a copper foil is selected as a lower electrode layer, and one surface (a first lower electrode surface) of the copper foil is attached to the other surface (a second dielectric layer surface) of the ionic gel dielectric layer. Herein, the copper foil is also used as a shield layer of the upper electrode layer, to shield electric field interference inside the robot (the intelligent device).

Finally, the other surface (a second lower electrode surface) of the copper foil is also attached to the polymer thin film (a second encapsulation layer). In this case, a flexible robot skin capable of performing high-sensitivity dual-modal sensing.

Example 3. First, a conductive carbon cloth with bending performance is selected as an electrode material, the conductive carbon cloth is cut into a size of an electrode by using a laser, to obtain double electrodes (at least two sub-upper electrodes) of an upper electrode layer, each electrode (each sub-upper electrode) of the double electrodes being an interdigital electrode, and one surface (a second sub-upper electrode surface) of the double electrodes is attached to a polymer thin film (a first encapsulation layer).

Subsequently, a capacitance sensing active material is selected as a dielectric layer, an insulating material thin film is obtained through processing, a surface of the insulating material thin film or the entire insulating material thin film having a microstructure, to obtain an insulating material thin film dielectric layer, and one surface (a first dielectric layer surface) of the insulating material thin film dielectric layer is attached to the other surface (a first sub-upper electrode surface) of the double electrodes.

Next, a copper foil is selected as a lower electrode layer, and one surface (a first lower electrode surface) of the copper foil is attached to the other surface (a second dielectric layer surface) of the insulating material thin film dielectric layer. Herein, the copper foil is also used as a shield layer of the upper electrode layer, to shield electric field interference inside the robot (the intelligent device).

Finally, the other surface (a second lower electrode surface) of the copper foil is also attached to the polymer thin film (a second encapsulation layer). In this case, a flexible robot skin capable of performing high-sensitivity dual-modal sensing.

Example 4. First, a metal electrode obtained by evaporating a conductive metal on a polymer (for example, PET or PI) thin film is selected as an electrode material, to obtain double electrodes (at least two sub-upper electrodes) of an upper electrode layer, each electrode (each sub-upper electrode) of the double electrodes being an interdigital electrode, and one surface (a second sub-upper electrode surface) of the double electrodes is attached to the polymer thin film (a first encapsulation layer).

Subsequently, a capacitance sensing active material with an ion sensing characteristic is selected as a dielectric layer, an ionic gel dielectric layer is obtained through processing, a surface of the ionic gel dielectric layer or the entire ionic gel dielectric layer having a microstructure, and one surface (a first dielectric layer surface) of the ionic gel dielectric layer is attached to the other surface (a first sub-upper electrode surface) of the double electrodes.

Next, a copper foil is selected as a lower electrode layer, and one surface (a first lower electrode surface) of the copper foil is attached to the other surface (a second dielectric layer surface) of the ionic gel dielectric layer. Herein, the copper foil is also used as a shield layer of the upper electrode layer, to shield electric field interference inside the robot (the intelligent device).

Finally, the other surface (a second lower electrode surface) of the copper foil is also attached to the polymer thin film (a second encapsulation layer). In this case, a flexible robot skin capable of performing high-sensitivity dual-modal sensing.

Example 5. First, an electrode printed on a thermoplastic polyurethanes (TPU) rubber thin film is selected as an electrode material, to obtain double electrodes (at least two sub-upper electrodes) of an upper electrode layer, each electrode (each sub-upper electrode) of the double electrodes being an interdigital electrode, and one surface (a second sub-upper electrode surface) of the double electrodes is attached to a polymer thin film (a first encapsulation layer).

Subsequently, a capacitance sensing active material with an ion sensing characteristic is selected as a dielectric layer, an ionic gel dielectric layer is obtained through processing, a surface of the ionic gel dielectric layer or the entire ionic gel dielectric layer having a microstructure, and one surface (a first dielectric layer surface) of the ionic gel dielectric layer is attached to the other surface (a first sub-upper electrode surface) of the double electrodes.

Next, a copper foil is selected as a lower electrode layer, and one surface (a first lower electrode surface) of the copper foil is attached to the other surface (a second dielectric layer surface) of the ionic gel dielectric layer. Herein, the copper foil is also used as a shield layer of the upper electrode layer, to shield electric field interference inside the robot (the intelligent device).

Finally, the other surface (a second lower electrode surface) of the copper foil is also attached to the polymer thin film (a second encapsulation layer). In this case, a flexible robot skin capable of performing high-sensitivity dual-modal sensing.

Example 6. First, a metal mesh electrode obtained by spraying a silver nanowire on a polymer (for example, PET or PI) thin film is selected as an electrode material, to obtain double electrodes (at least two sub-upper electrodes) of an upper electrode layer, each electrode (each sub-upper electrode) of the double electrodes being an interdigital electrode, and one surface (a second sub-upper electrode surface) of the double electrodes is attached to the polymer thin film (a first encapsulation layer).

Subsequently, a capacitance sensing active material with an ion sensing characteristic is selected as a dielectric layer, an ionic gel dielectric layer is obtained through processing, a surface of the ionic gel dielectric layer or the entire ionic gel dielectric layer having a microstructure, and one surface (a first dielectric layer surface) of the ionic gel dielectric layer is attached to the other surface (a first sub-upper electrode surface) of the double electrodes.

Next, a copper foil is selected as a lower electrode layer, and one surface (a first lower electrode surface) of the copper foil is attached to the other surface (a second dielectric layer surface) of the ionic gel dielectric layer. Herein, the copper foil is also used as a shield layer of the upper electrode layer, to shield electric field interference inside the robot (the intelligent device).

Finally, the other surface (a second lower electrode surface) of the copper foil is also attached to the polymer thin film (a second encapsulation layer). In this case, a flexible robot skin capable of performing high-sensitivity dual-modal sensing.

It may be understood that, the sensor provided in the embodiments of this disclosure can sense various objects of different materials, including an insulator, a conductor, an organism, and the like, and the sensor has two sensing functions of proximity sensing and contact sensing and has millimeter-level sensing accuracy on an object, and a spatial resolution is reduced to a millimeter level. High-density sensing can be implemented through a flexible sensor array device arranged in an array, the sensor array device can be simply attached to a surface of an intelligent device (for example, a robot), and omnidirectional sensing of the intelligent device on the surrounding environment is implemented.

An exemplary structure of a software module implemented by a sensing apparatus 455 provided in an embodiment of this disclosure is continuously described below. In some embodiments, As shown in FIG. 2, the software module in the sensing apparatus 455 stored in the memory 450 may include:

a first capacitance acquiring module 4551, configured to acquire first capacitance information at an electrode gap of each sensor in a sensor array of the intelligent device by using a controller when an approaching object approaches the intelligent device, to obtain a first capacitance information set;

a proximity sensing module 4552, configured to determine distance information from the approaching object according to the first capacitance information set, to obtain a distance information set;

a second capacitance acquiring module 4553, configured to acquire second capacitance information between an upper electrode layer and a lower electrode layer under the action of a dielectric layer of each sensor by using the controller when the intelligent device acts on a contact object, to obtain a second capacitance information set;

a contact sensing module 4554, configured to determine, according to the second capacitance information set, an acting force acting on the contact object, to obtain an acting force set; and a sensing module 4555, configured to complete dual-modal sensing on a target object according to the distance information set and/or the acting force set, the target object including the approaching object and the contact object.

In an embodiment of this disclosure, the dielectric layer is an ionic gel dielectric layer, the second capacitance acquiring module 4553 is further configured to acquire a target area of overlap between the upper electrode layer and the lower electrode layer under the action of the ionic gel dielectric layer of each sensor by using the controller; and determine a capacitance corresponding to the target area of overlap according to a relationship between a preset area and a capacitance, to obtain the first capacitance information, so as to obtain the first capacitance information set.

In another embodiment of this disclosure, the dielectric layer is an insulating material thin film dielectric layer, the second capacitance acquiring module 4553 is further configured to acquire a target distance between the upper electrode layer and the lower electrode layer under the action of the insulating material thin film dielectric layer of each sensor by using the controller; and determine a capacitance corresponding to the target distance according to a relationship between a preset distance and a capacitance, to obtain the second capacitance information, so as to obtain the second capacitance information set.

An embodiment of this disclosure provides a computer-readable storage medium storing executable instructions. When the executable instructions are executed by a controller, the controller is caused to perform the sensing method provided in the embodiments of this disclosure, for example, the sensing method shown in FIG. 25.

In some embodiments, the storage medium may be a memory such as a ferroelectric RAM (FRAM), a ROM, a programmable ROM (PROM), an electrically programmable ROM (EPROM), an electrically erasable PROM (EEPROM), a flash memory, a magnetic surface memory, an optical disk, or a CD-ROM, or may be any device including one of or any combination of the foregoing memories.

In some embodiments, the executable instructions can be written in a form of a program, software, a software module, a script, or code and according to a programming language (including a compiler or interpreter language or a declarative or procedural language) in any form, and may be deployed in any form, including an independent program or a module, a component, a subroutine, or another unit suitable for use in a computing environment.

In an example, the executable instructions may, but do not necessarily, correspond to a file in a file system, and may be stored in a part of a file that saves another program or other data, for example, be stored in one or more scripts in a HyperText Markup Language (HTML) file, stored in a file that is specially used for a program in discussion, or stored in the plurality of collaborative files (for example, be stored in files of one or modules, subprograms, or code parts).

In an example, the executable instructions can be deployed for execution on one computing device, execution on a plurality of computing devices located at one location, or execution on a plurality of computing devices that are distributed at a plurality of locations and that are interconnected through a communication network.

Based on the foregoing, according to the embodiments of this disclosure, because a sensor includes a three-layer sensing structure formed by an upper electrode layer, a dielectric layer, and a lower electrode layer, the sensor can sense an acting force on a contact object according to capacitance information of the three-layer sensing structure. Moreover, because the upper electrode layer is formed by at least two sub-upper electrodes, distance information from an approaching object can be sensed according to capacitance information at an electrode gap between the at least two sub-upper electrodes Therefore, two manners of proximity sensing and contact sensing on a target object can be achieved, thereby improving a sensing level and improving the diversity of a sensing function of the sensor.

The foregoing descriptions are merely embodiments of this disclosure and are not intended to limit the protection scope of this disclosure. Any modification, equivalent replacement, or improvement made without departing from the spirit and range of this disclosure shall fall within the protection scope of this disclosure.

What is claimed is:

1. A sensor, comprising:
an upper electrode layer, a dielectric layer, and a lower electrode layer;
an encapsulation layer encapsulating a three-layer sensing structure formed by the upper electrode layer, the dielectric layer, and the lower electrode layer, the encapsulation layer comprising a first encapsulation layer and a second encapsulation layer;
a first dielectric layer surface of the dielectric layer being attached to a first upper electrode surface of the upper electrode layer;
a second dielectric layer surface of the dielectric layer being attached to a first lower electrode surface of the lower electrode layer, the second dielectric layer surface being opposite to the first dielectric layer surface;
the upper electrode layer comprising at least two sub-upper electrodes arranged in an array, an electrode gap existing between the at least two sub-upper electrodes; and
the sensor being configured to determine distance information from an approaching object according to first capacitance information at the electrode gap, and an acting force acting on a contact object according to second capacitance information between the upper electrode layer and the lower electrode layer under action of the dielectric layer.

2. The sensor of claim 1, wherein
the first encapsulation layer is encapsulated on a second upper electrode surface of the upper electrode layer, the second upper electrode surface is opposite to the first upper electrode surface;
the second encapsulation layer is encapsulated on a second lower electrode surface of the lower electrode layer, the second lower electrode surface is opposite to the first lower electrode surface.

3. The sensor of claim 2, wherein the encapsulation layer is a flexible material thin film encapsulation layer.

4. The sensor of claim 1, wherein each sub-upper electrode of the at least two sub-upper electrodes is an interdigital electrode or a circular electrode.

5. The sensor of claim 4, wherein the sub-upper electrode is the interdigital electrode and the at least two sub-upper electrodes are coplanar and staggered.

6. The sensor of claim 4, wherein the sub-upper electrode is the circular electrode and the at least two sub-upper electrodes are coplanar and concentric.

7. The sensor of claim 1, wherein each sub-upper electrode of the at least two sub-upper electrodes is at least one of a conductive carbon cloth electrode, an evaporation metal electrode, a printed electrode, or a spraying metal mesh electrode.

8. The sensor of claim 1, wherein the dielectric layer is an ionic gel dielectric layer or an insulating material thin film dielectric layer.

9. The sensor of claim 8, wherein the dielectric layer is the ionic gel dielectric layer, the ionic gel dielectric layer has a microstructure, and the sensor is configured to, under the action of the microstructure of the ionic gel dielectric layer, determine the second capacitance information between the upper electrode layer and the lower electrode layer according to a contact area between the upper electrode layer and the ionic gel dielectric layer and a contact area between the lower electrode layer and the ionic gel dielectric layer.

10. The sensor of claim 8, wherein the dielectric layer is the insulating material thin film dielectric layer, the insulating material thin film dielectric layer has a microstructure, and the sensor is configured to, under the action of the microstructure of the insulating material thin film dielectric layer, determine the second capacitance information between the upper electrode layer and the lower electrode layer according to a distance between the upper electrode layer and the insulating material thin film dielectric layer and a distance between the lower electrode layer and the insulating material thin film dielectric layer.

11. The sensor of claim 1, wherein the lower electrode layer is a conductive thin film electrode layer.

12. A device, comprising:
a controller; and
a sensor array connected to the controller, each sensor in the sensor array comprising:
  an upper electrode layer, a dielectric layer, and a lower electrode layer;
  an encapsulation layer encapsulating a three-layer sensing structure formed by the upper electrode layer, the dielectric layer, and the lower electrode layer, the encapsulation layer comprising a first encapsulation layer and a second encapsulation layer;
  a first dielectric layer surface of the dielectric layer being attached to a first upper electrode surface of the upper electrode layer;
  a second dielectric layer surface of the dielectric layer being attached to a first lower electrode surface of the lower electrode layer, the second dielectric layer surface being opposite to the first dielectric layer surface; and
  the upper electrode layer comprising at least two sub-upper electrodes arranged in an array, an electrode gap existing between the at least two sub-upper electrodes, wherein
    distance information from an approaching object being determined according to first capacitance information at the electrode gap, and
    an acting force acting on a contact object being determined according to second capacitance information between the upper electrode layer and the lower electrode layer under action of the dielectric layer.

13. The device of claim 12, wherein
the first encapsulation layer is encapsulated on a second upper electrode surface of the upper electrode layer, the second upper electrode surface is opposite to the first upper electrode surface;
the second encapsulation layer is encapsulated on a second lower electrode surface of the lower electrode layer, the second lower electrode surface is opposite to the first lower electrode surface.

14. The device of claim 12, wherein each sub-upper electrode of the at least two sub-upper electrodes is an interdigital electrode and the at least two sub-upper electrodes are coplanar and staggered.

15. The device of claim 12, wherein each sub-upper electrode of the at least two sub-upper electrodes is an circular electrode and the at least two sub-upper electrodes are coplanar and concentric.

16. The device of claim 12, wherein the dielectric layer is an ionic gel dielectric layer, the ionic gel dielectric layer has a microstructure, and under the action of the microstructure of the ionic gel dielectric layer, the second capacitance information between the upper electrode layer and the lower electrode layer is determined according to a contact area between the upper electrode layer and the ionic gel dielectric layer and a contact area between the lower electrode layer and the ionic gel dielectric layer.

17. The device of claim 12, wherein the dielectric layer is an insulating material thin film dielectric layer, the insulating material thin film dielectric layer has a microstructure, and under the action of the microstructure of the insulating material thin film dielectric layer, the second capacitance information between the upper electrode layer and the lower electrode layer is determined according to a distance between the upper electrode layer and the insulating material thin film dielectric layer and a distance between the lower electrode layer and the insulating material thin film dielectric layer.

18. A sensing method, performed by the device of claim 12, the method comprising:
  in response to an approaching object approaching the device, obtaining a first capacitance information set by acquiring, with a controller of the device, first capacitance information at an electrode gap of each sensor in a sensor array of the device;
  obtaining a distance information set by determining distance information from the approaching object according to the first capacitance information set;
  in response to the device acting on a contact object, obtaining a second capacitance information set by acquiring, with the controller of the device, second capacitance information between an upper electrode layer and a lower electrode layer under the action of a dielectric layer of each sensor;
  determining, according to the second capacitance information set, an acting force acting on the contact object, to obtain an acting force set; and
  completing dual-modal sensing on a target object according to the distance information set and the acting force set, the target object comprising the approaching object and the contact object.

* * * * *